United States Patent
Mills et al.

(10) Patent No.: US 11,493,976 B2
(45) Date of Patent: Nov. 8, 2022

(54) METHODS AND APPARATUS TO DYNAMICALLY LIMIT CURRENT

(71) Applicant: Texas Instruments Incorporated, Dallas, TX (US)

(72) Inventors: Michael James Mills, Plano, TX (US); Mohammad Atiqur Rahman, Allen, TX (US); Eric Beljaars, Garland, TX (US); Nagesh Narayana Swamy, Bangalore (IN)

(73) Assignee: Texas Instruments Incorporated, Dallas, TX (US)

(*) Notice: Subject to any disclaimer, the term of this patent is extended or adjusted under 35 U.S.C. 154(b) by 241 days.

(21) Appl. No.: 16/366,819

(22) Filed: Mar. 27, 2019

(65) Prior Publication Data
US 2020/0310512 A1    Oct. 1, 2020

(51) Int. Cl.
*H03K 17/0812*    (2006.01)
*G06F 1/3206*    (2019.01)

(52) U.S. Cl.
CPC ..... *G06F 1/3206* (2013.01); *H03K 17/08122* (2013.01)

(58) Field of Classification Search
CPC ...... G06F 1/266; G06F 1/3206; G06F 1/3287; H03K 17/08122; H03K 17/0822; Y02D 10/00
See application file for complete search history.

(56) References Cited

U.S. PATENT DOCUMENTS

| | | | | |
|---|---|---|---|---|
| 2003/0063420 A1* | 4/2003 | Pahl | ...................... | H02H 1/0015 361/93.1 |
| 2004/0228057 A1* | 11/2004 | Mayama | ................. | H02H 9/025 361/100 |
| 2005/0135034 A1* | 6/2005 | Johnson | .................. | H02H 3/087 361/93.1 |
| 2011/0085274 A1* | 4/2011 | Jarman | ................. | H02H 3/0935 361/93.4 |
| 2015/0380924 A1* | 12/2015 | Ohwaki | ............... | H02H 3/0935 361/93.7 |
| 2019/0036365 A1* | 1/2019 | Regupathy | .......... | H02J 7/00034 |
| 2019/0393694 A1* | 12/2019 | Venigalla | ............. | H02H 11/002 |
| 2020/0059083 A1* | 2/2020 | Li | ...................... | H03K 17/0822 |

* cited by examiner

*Primary Examiner* — Jaweed A Abbaszadeh
*Assistant Examiner* — Brian J Corcoran
(74) *Attorney, Agent, or Firm* — Mark A. Valetti; Charles A. Brill; Frank D. Cimino

(57) ABSTRACT

Methods, apparatus, systems and articles of manufacture are disclosed to allow dynamic changing between current limiting methods. A power delivery controller comprising: a power control device; a first current control device, the first current control device to control the power control device when a current level associated with a current flowing between a first device and a second device exceeds a first adjustable current threshold value; a second current control device to control the power control device when the current level exceeds a second adjustable current threshold value; and a configuration manager to, during runtime, set a first configuration setting of the first current control device and a second configuration setting of the second current control device, the first configuration setting and second configuration setting based on a negotiated contract corresponding to the first device and the second device.

18 Claims, 8 Drawing Sheets

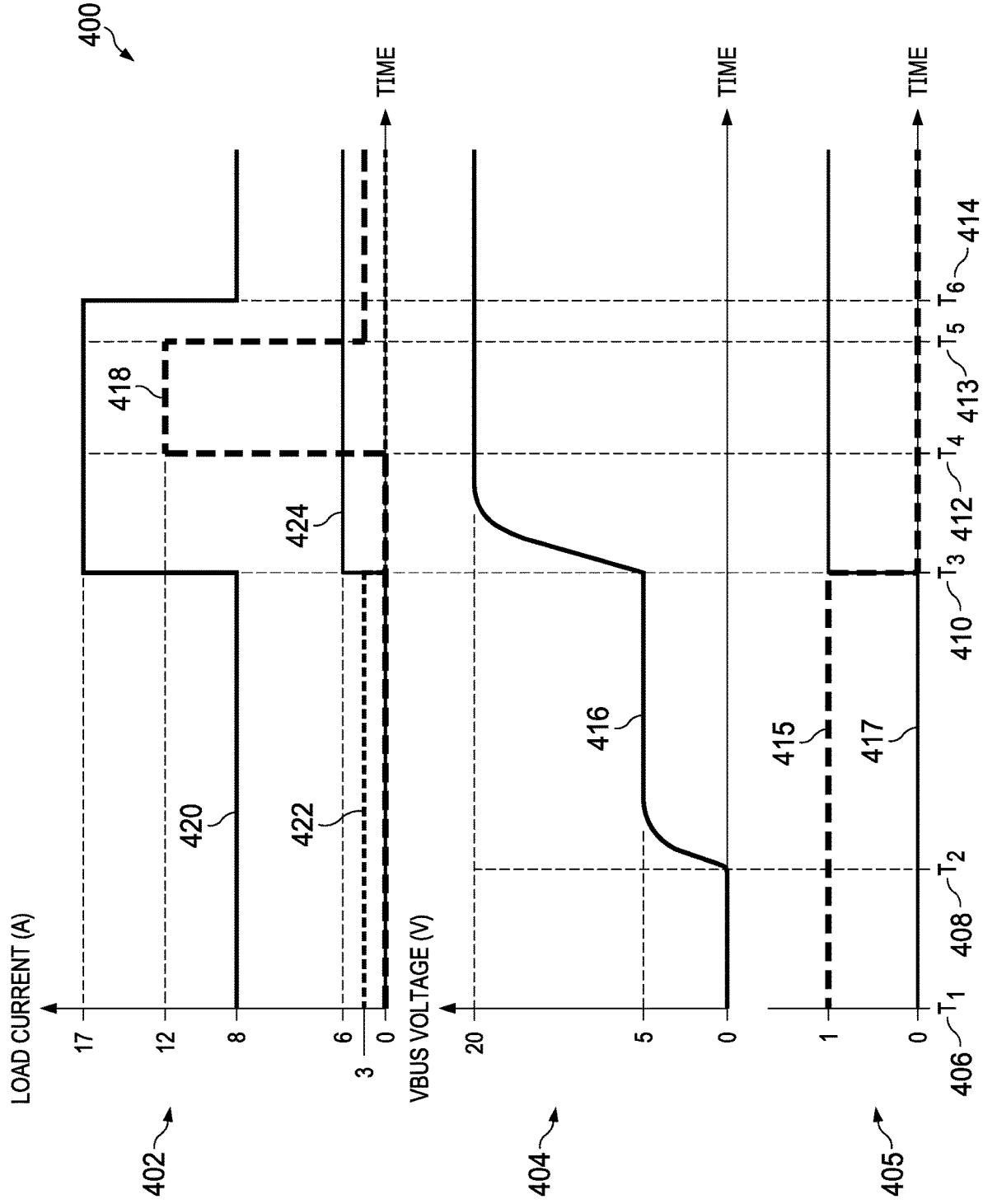

METHODS AND APPARATUS TO DYNAMICALLY LIMIT CURRENT

FIELD OF THE DISCLOSURE

This disclosure relates generally to power control, and, more particularly, to methods and apparatus to dynamically limit current.

BACKGROUND

In recent years, Universal Serial Bus (USB) functionality has been enhanced through the development of USB type-C (USB-C). The USB-C interface is reversible and supports protocols for High Definition Multimedia Interface (HDMI), Video Graphics Array (VGA), DisplayPort, and other types of connections from a single port. USB-C interfaces also provide USB Power Delivery (PD) capabilities.

BRIEF DESCRIPTION OF THE DRAWINGS

FIG. 4 is a timing diagram including current threshold values and a current associated with a transition from a first voltage level to a second voltage level when implementing the configuration manager of FIGS. 2 and 3.

The figures are not to scale. In general, the same reference numbers will be used throughout the drawing(s) and accompanying written description to refer to the same or like parts.

Figure 1:
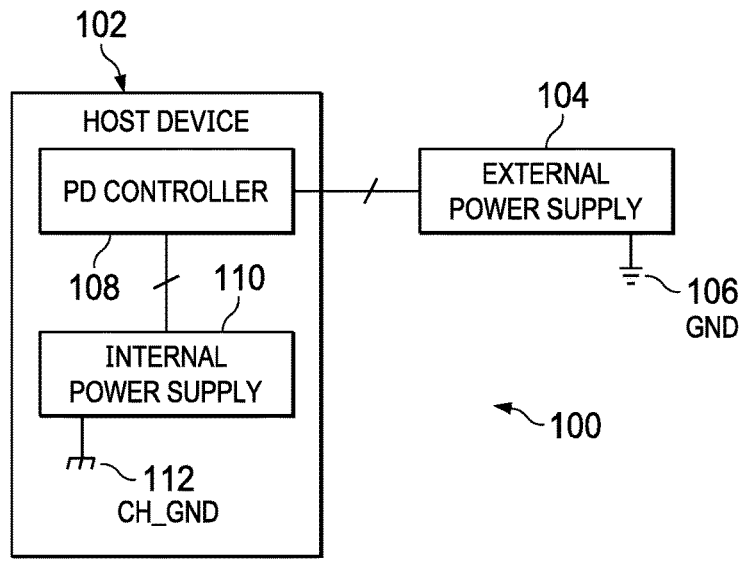
FIG. 1 is a schematic illustration of an example power delivery system including an example host device, an example external power supply, and a ground node.

Descriptors "first," "second," "third," etc. are used herein when identifying multiple elements or components which may be referred to separately. Unless otherwise specified or understood based on their context of use, such descriptors are not intended to impute any meaning of priority or ordering in time but merely as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Certain examples disclosed herein increase the functionality of a power delivery controller by changing between different current limiting methods during runtime of a controller. A power delivery controller comprising: a power control device; a first current control device coupled to the power control device, the first current control device configured to control the power control device when a current level associated with a current flowing between a first device and a second device exceeds a first adjustable current threshold value; a second current control device coupled to the power control device, the second current control device configured to control the power control device when the current level exceeds a second adjustable current threshold value; and a configuration manager, coupled to the first current control device and the second current control device, the configuration manager configured to, during runtime, set a first configuration setting of the first current control device and a second configuration setting of the second current control device, wherein the first configuration setting corresponds to the first adjustable current threshold value and the second configuration setting corresponds to the second adjustable current threshold value, the first configuration setting and second configuration setting based on a negotiated contract corresponding to the first device and the second device. As used herein, the term "coupled" is defined as connected directly or indirectly (e.g., through one or more intervening structures and/or layers, such as resistors, capacitors, inductors, transistors, voltage clamps, switches, buffers amplifiers, etc.). As used herein, the term "soft startup" and/or its derivatives (e.g., soft start, soft-start, soft-startup, soft starting, etc.) are defined as corresponding to structures of functions that control the rate of current flow when a switch starts operation and prevents the current level from overshooting a pre-determined and/or sensed value that does not damages the components of the switch or components coupled to the switch.

With the increased use of USB-C interfaces, many device manufacturers have designed systems to take advantage of the functionality of USB-C. The systems are, for example, laptop computers, desktop computers, speakers, monitors, power supplies, etc. Many devices (e.g., laptop computers) are designed to utilize the PD functionality that USB-C facilitates. Laptop computers that utilize the PD functionality include power delivery controllers to control the power either sourced from a device or provided to a laptop of other USB-C device.

When a first USB-C device (e.g., a laptop computer, a power supply, a desktop computer, etc.) utilizes PD functionality, the first device negotiates a contract with a second device. The contract defines a voltage level and a current level at which the second device is to provide power to first device. After the contract is established, the controller included with the first USB-C device (e.g., a laptop computer) controls the power either sourced or provided to the first USB-C device. The first USB-C device uses hardware current limiting, also known as "current clamping", firmware circuit breakers, and hardware circuit breakers to control the flow of current between the first USB-C device and the second device. Current limiting methods, whether firmware or hardware, regulate the level of current flowing through the switch. In some examples, the current is limited by changing the resistance of the switch. Circuit breakers, whether firmware or hardware, open the switch and stop the flow of current.

USB-C devices operate based upon USB 2.0 and USB 3.0 specifications. These specifications support the majority of USB-C functionality including HDMI, VGA, DisplayPort, and other types of data transfer. Regardless of the specification, when a USB-C capable device connects to another USB-C capable device, the two devices negotiate a default contract to establish and govern communications between the two devices.

Contracts between devices are negotiated when a first device connects to a second device over a USB-C cable. The first device detects the cable capabilities of the cable or interface type if the capabilities of the cable are already known. The first device may be a sink device (e.g., a laptop) and the second device may be a source device (e.g., a power supply). The second device sends a source capabilities message to the first device representing the power delivery capabilities of the second device (e.g., 15 watts, 45 watts, 100 watts). The first device generates and sends an acknowledgement receipt. The first device analyzes the second devices capabilities and determines whether the second device has PD capabilities. If the first device determines that the second device has PD capabilities, the first device determines what power to draw from the second device. The first device requests an amount of power to draw from the second device. The second device sends an acknowledgement receipt accepting the request. The first device enters a standby mode and the second device transitions from a first voltage level to a second voltage level. The first device generates and sends an acknowledgement receipt to the second device indicating the first device has successfully transitioned to the second voltage as well. The second device sends a message to the first device indicating the second device has settled at the second voltage level and the first device sends an acknowledgement receipt. This process establishes a contract between the first device and the second device. After the contract has been formed, the first device sinks power from the source device (e.g., the second device) until a new contract is requested by the first device. Contracts are negotiated between USB-C devices over the configuration channel (CC) lines of USB-C interfaces. Default contracts that are negotiated between USB-C devices are known as implicit contracts (e.g., according to a protocol, according to a standard, etc.). In some examples, a USB-C device includes a controller that negotiates contracts between the USB-C devices. Contracts that are negotiated between USB-C devices according to the power capabilities of the USB-C devices (e.g., customized to the particular USB-C devices) are known as explicit contracts.

The default contract is a contract between the laptop and the power supply that operates at 5 volts (V). When using the USB 2.0 specification, the current limit is 600 milliamps (mA). When using the USB 3.0 specification, the current limit is 3 amps (A). Under USB 3.0, a USB-C capable device can provide up to 15 watts (W) of power at 5 volts. The current range for USB 3.0 includes current values up to 3 amps. For example, if a USB-C capable laptop connects to a USB-C capable power supply to charge the laptop, the laptop and the power supply negotiate the default contract first before power is supplied to the laptop. In the example, whether operating based on USB 2.0 or USB 3.0, the USB-C controller on the laptop and/or the power supply controls a switch to control the flow of current between the first device (e.g., the laptop) and the second device (e.g., the power supply). The switch is a power control device and may be a transistor such as a Metal-Oxide-Semiconductor Field-Effect-Transistor (MOSFET), Bipolar Junction Transistor (BJT), Junction Gate Field-Effect-Transistor (JFET), etc. The controller applies control techniques to regulate the current that is flowing between the first device and the second device. The controller regulates the current flowing between the first device and the second device by regulating the current flowing from the drain terminal to the source terminal of the MOSFET. The controller can accomplish this by regulating the resistance between the drain terminal and the source terminal of the MOSFET being used while the MOSFET is conducting current.

The controller can regulate the current flowing between the first device and the second device by regulating the resistance between the drain terminal and the source terminal of the MOSFET being used while the MOSFET is conducting current by increasing or decreasing the output impedance of a gate driver which effects the current flowing to the gate terminal of the MOSFET. This either increases or decreases the mobility of the charges in the MOSFET. Alternatively, the controller can regulate the resistance between the drain terminal and the source terminal of the MOSFET being used while the MOSFET is conducting current by increasing or decreasing the voltage between the gate terminal and the source terminal of the MOSFET. This has an inverse relationship to the resistance between the drain terminal and the source terminal such that when the voltage between the gate terminal and the source terminal decreases, the resistance between the drain terminal and the source terminal increases. When the voltage between the gate terminal and the source terminal increases, the resistance between the drain terminal and the source terminal decreases. Regulating the current flowing from the drain terminal to the source terminal is commonly referred to as "current clamping" or hardware current limiting.

Hardware current limiting provides a controller with the ability to protect devices connected to a power supply (e.g., a desktop computer) from being damaged when a short occurs at one of the devices. For example, if a power supply is supplying power to three devices (e.g., a cellular phone, a keyboard, and a mouse) and one of the devices experiences a short, hardware current limiting prevents the other two devices from experiencing the short because the controller clamps the current flowing from the drain terminal of the MOSFET to the source terminal of the MOSFET at the current limit for the contract using hardware current limiting. Furthermore, hardware current limiting prevents a device from starting into a shorted power supply by regulating the current flowing from the drain terminal to the source terminal of the MOSFET. Hardware current limiting allows for protection of the MOSFET from being damaged from shorts and other potential damages that could occur when multiple devices are connected to the same power supply.

When the controller increases the resistance between the drain terminal and the source terminal, the MOSFET in use dissipates a larger amount of power. The MOSFET can sustain the increased power dissipation when the controller clamps the current between the drain terminal and the source terminal for a specified amount of time because the overall power dissipated does not take the MOSFET out of the Safe Operating Area (SOA) of the MOSFET. The SOA of a MOSFET is based on the current flowing between the drain terminal and the source terminal and the voltage between the drain terminal and the source terminal of the MOSFET. The SOA of the MOSFET corresponds to the voltage and current levels that the MOSFET is expected to operate under without damage to the MOSFET. Typically, when a MOSFET approaches an SOA limit, the MOSFET will be shut off (e.g., opened).

However, if a USB-C device wants to supply a larger amount of power using PD, the USB-C device operates based on the alternate mode specification. For example, when a first USB-C capable device such as a power supply is connected to a second USB-C capable device (e.g., a laptop) and is operating based on the USB PD specification, the power supply and the laptop negotiate a new contract after the default contract has been engaged. The new contract can supply up to 100 watts of power at a voltage between 5 volts and 20 volts. The current for the new contract includes current values up to 5 amps. Additionally, large current transients occur when transitioning from a lower voltage to a higher voltage. For example, the first USB-C device is supplying power based on the USB PD specification to the second USB-C device or another sub-device in the second USB-C device that is charging a 600 microfarad (µF) capacitor from 0 volts to 20 volts in 1 millisecond (ms) with a soft start controller. In such an example, the current that the first USB-C device supplies is shown in equation 1 below:

$$I = \frac{\Delta V * C}{\Delta T} = \frac{12 * 600 * 10^{-6}}{1 * 10^{-3}} = 12A \qquad \text{Equation - 1}$$

In such an example, although the controller in the second USB-C device is charging the 600 µF capacitor via a soft-start controller, the current demanded by the second USB-C device will be significantly large. In such an example, if the controller in the first USB-C device regulates the current flowing from the drain terminal of the MOSFET to the source terminal of the MOSFET, the MOSFET will not be within the SOA of the MOSFET. The controller is forced to turn off the MOSFET or risk damaging the MOSFET. One way to prevent turning off the MOSFET would be to use a MOSFET with a larger SOA, however, this requires a physically larger and more expensive MOSFET.

Hardware current limiting is a good method for limiting current in the lower voltage contracts for USB-C capable devices (e.g., 5 volt contracts). However, when a USB-C capable device employs a higher voltage contract (e.g., a contract between 5 volts and 20 volts), a different method is required to regulate the current flowing from the drain terminal of the MOSFET to the source terminal of the MOSFET. This different method can be accomplished by monitoring the current with firmware and turning off the MOSFET, with firmware, when the current is too high such that it will cause damage to the MOSFET.

In both current limiting methods, either by hardware current limiting or by monitoring the current from the drain terminal of the MOSFET to the source terminal of the MOSFET and controlling the MOSFET to prevent damages to the MOSFET, the controller includes a hardware circuit breaker that can be programmed to turn off the MOSFET if the current flowing from the drain terminal to the source terminal exceeds a preset limit. This provides protection for the MOSFET when a high transient current flows through the MOSFET and has the potential to damage the MOSFET.

Alternative techniques to accomplish the firmware method of current limiting for PD capable devices by designating a specific USB-C controller and a specific USB-C port for power supplies. Thus, when a first device (e.g., a laptop) negotiates a contract with the power supply (e.g., a second device), the first device monitors and controls the current from the drain terminal of the MOSFET to the source terminal of the MOSFET with the firmware. Additional alternative techniques also employ a hardware circuit breaker; however, the hardware circuit breaker is static and cannot be adjusted during the runtime of a controller and the controller must be reprogrammed in order to adjust the hardware circuit breaker. A static hardware circuit breaker does not allow for high transient currents to flow through the MOSFET when the high transient current does not damage the MOSFET. Because the hardware circuit breaker is static, the MOSFET will be opened for transient currents that do not damaged the MOSFET, the controller will cause the MOSFET to falsely open, and the first device will not be able to properly function. Additionally, alternative techniques cannot transition from hardware current limiting to the firmware method of current limiting. Alternative techniques cannot benefit from the use of hardware current limiting while also benefiting from the use of the firmware method of current control.

Examples disclosed herein include a power delivery controller comprising: a power control device; a first current control device coupled to the power control device, the first current control device configured to control the power control device when a current level associated with a current flowing between a first device and a second device exceeds a first adjustable current threshold value; a second current control device coupled to the power control device, the second current control device configured to control the power control device when the current level exceeds a second adjustable current threshold value; and a configuration manager, coupled to the first current control device and the second current control device, the configuration manager configured to, during runtime, set a first configuration setting of the first current control device and a second configuration setting of the second current control device, wherein the first configuration setting corresponds to the first adjustable current threshold value and the second configuration setting corresponds to the second adjustable current threshold value, the first configuration setting and second configuration setting based on a negotiated contract corresponding to the first device and the second device.

Examples disclosed herein allow for the dynamic limitation of current in an application. That is, the configuration settings corresponding to one or more current limiting methods used to control the current level in the application can be adjusted during the runtime of the application. Runtime of an application includes the operation of the application (e.g., time when the application is executing). For example, in a USB-C PD controller application, examples disclosed herein allow for the configuration settings corresponding to one or more current limiting methods used to control the current level in the USB-C PD controller to be adjusted while the USB-C PD controller is operating to control, for example a contract negotiated between two USB-C capable devices. That is, when implementing the examples disclosed herein, a USB-C PD controller and/or any other type of controller can adjust the configuration settings corresponding to one or more current limiting method used to control the current level in the application without needing to power down the application. Moreover, when implementing the examples disclosed herein, a USB-C PD controller and/or any other type of controller can adjust the configuration settings corresponding to one or more current limiting method used to control the current level in the application without entering a compile time, a load time, an instillation time, a link time, or a distribution time for the application.

FIG. 1 is a schematic illustration of an example power delivery system 100 including an example host device 102, an example external power supply 104, and a ground node (GND) 106. The example host device 102 includes an example power delivery controller 108, an example internal power supply 110, and an example chassis ground node ($CH_{GND}$) 112. In the example, the power delivery controller 108 is coupled to the external power supply 104. In the example, the external power supply is coupled to the ground node (GND) 106. In the illustrated example of FIG. 1, the power delivery controller 108 is coupled to the internal power supply 110 and the internal power supply 110 is coupled to the chassis ground ($CH_{GND}$) 112.

In the illustrated example, the example host device 102 is a laptop computer. Alternatively, the host device 102 may be a cellphone, a monitor, a device charging dock, etc. The example host device 102 draws power from the external power supply 104 to charge the internal power supply 110. In the illustrated example, the example external power supply 104 is an alternating current (AC) to direct current (DC) adapter. Alternatively, the external power supply 104 may be an external battery source, a wall outlet, another computer, etc. The example external power supply 104 supplies power to the example host device 102. Additionally, the external power supply 104 may supply power to multiple other devices.

In the illustrated example, the power delivery controller 108 is a controller designated to control USB-C communications with functionality to support PD capabilities. The example power delivery controller 108 regulates the flow of current from the external power supply 104 to the internal power supply 110. Additionally, the power delivery controller 108 controls the flow of current from the host device 102 to other devices (e.g., a cellular phone, a keyboard, a mouse) connected to the host device 102. The power delivery controller 108 regulates the current flowing from the external power supply 104 to the internal power supply 110 and/or other devices connected to the host device 102 by utilizing hardware current limiting, firmware circuit breakers, and hardware circuit breaker methods to regulate the current. In alternative examples the power delivery controller 108 may be implemented by one or more integrated circuits, logic circuits, microprocessors, graphics processing units (GPUs), digital signal processors (DSPs), or controllers from any desired family or manufacturer. Other examples disclosed herein include the power delivery controller 108 integrated within a device (e.g., the host device 102). Additionally or alternatively, the power delivery controller 108 may be implemented externally from the device (e.g., the host device 102) in one or more integrated circuits, logic circuits, microprocessors, GPUs, DSPs, or controllers from any desired family or manufacturer.

In the illustrated example, the internal power supply 110 is a battery power supply. The internal power supply 110 is coupled to the power delivery controller 108 and the chassis ground ($CH_{GND}$) 112. The example internal power supply 110 supplies the host device 102 with the power needed to operate.

Figure 2:
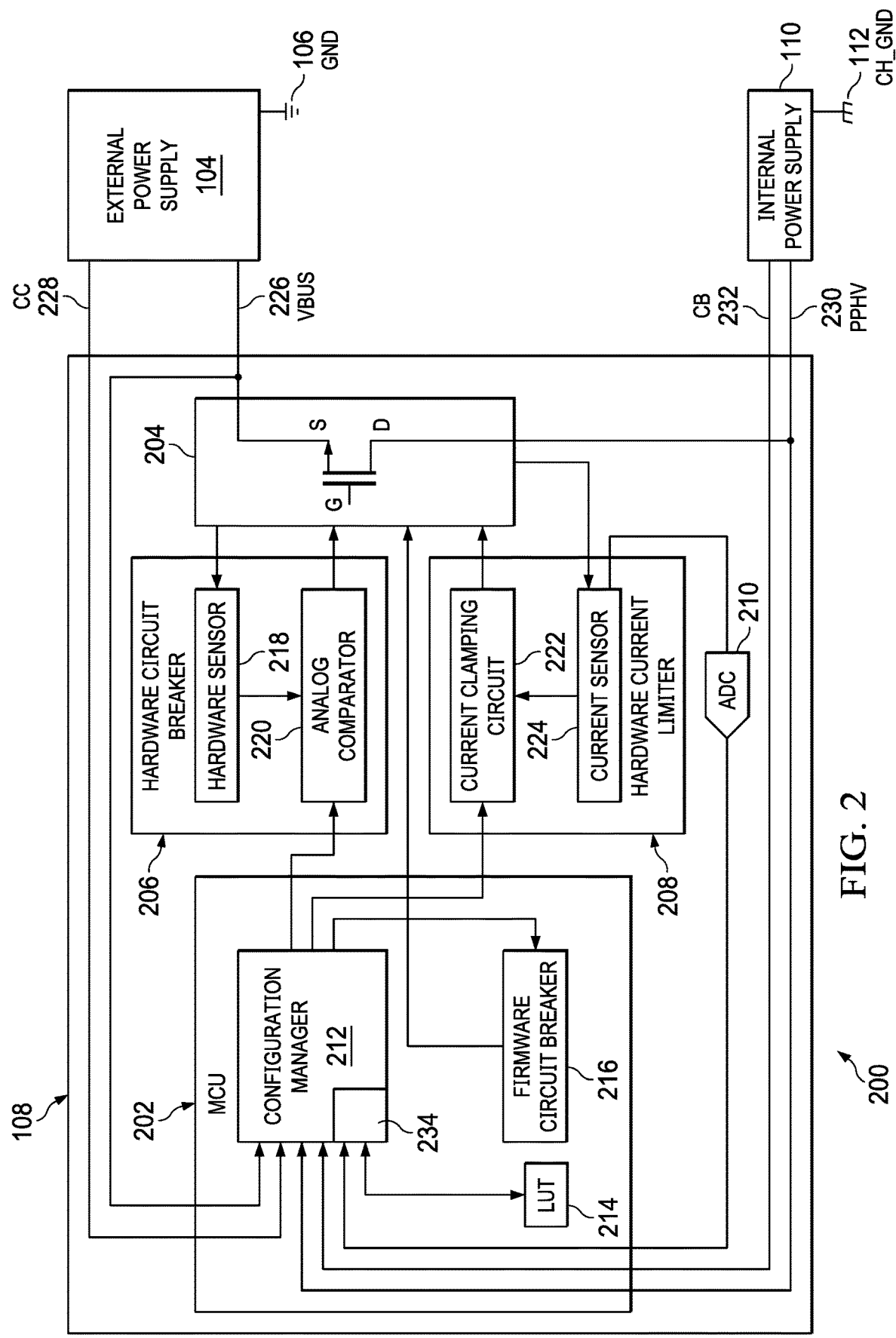
FIG. 2 is a schematic illustration showing additional detail of the example power delivery controller of FIG. 1.

FIG. 2 is a schematic illustration of an example power delivery system 200 including the power delivery controller 108, the external power supply 104, and the internal power supply 110 of FIG. 1. The example power delivery system 200 shows additional detail of the power delivery controller 108. The example power delivery controller 108 is coupled to the external power supply 104 and the internal power supply 110.

The example power delivery controller 108 includes a microcontroller unit 202 (MCU), a switch 204, a hardware circuit breaker 206, a hardware current limiter 208, and an analog-to-digital converter 210. In some examples, the switch 204 is a MOSFET. The microcontroller unit 202 includes a configuration manager 212, a look-up-table (LUT) 214, and a firmware circuit breaker 216.

The example hardware circuit breaker 206 includes a first hardware current sensor 218 and an analog comparator 220. The hardware current limiter 208 includes a current clamping circuit 222 and a second hardware current sensor 224.

The external power supply 104 is coupled to the ground node (GND) 106, the switch 204 and the configuration manager 212. The external power supply 104 is coupled to the switch 204 at the example VBUS node 226. The VBUS node 226 is the example node at which devices external to the host device 102 of FIG. 1 connect to the power delivery controller 108 to sink or source power. The external power supply 104 is coupled to the configuration manager 212 at the CC node 228. The CC node 228 is the example node at which devices external to the host device 102 of FIG. 1 connect to the power delivery controller 108 to communicate with the power delivery controller 108.

The internal power supply 110 is coupled to the chassis ground ($CH_{GND}$) 112 and the switch 204. The internal power supply 110 is coupled to the switch 204 at the PPHV node 230. The PPHV node 230 is the example node at which devices internal to the host device 102 of FIG. 1 connect to the power delivery controller 108. Additionally, the internal power supply 110 is coupled to the configuration manager 212 at the communication bus (CB) node. The CB node 232 is the example node at which devices internal to the host device 102 of FIG. 1 communicate with the configuration manager 212. In the example, the configuration manager 212 is coupled to the analog comparator 220, the current clamping circuit 222, the firmware circuit breaker 216, and the LUT 214. In the example, analog comparator 220 is coupled to the first hardware current sensor 218, the configuration manager 212, and the switch 204.

The example first hardware current sensor 218 is coupled to the analog comparator 220 and the switch 204. In the example, the current clamping circuit 222 is coupled to the configuration manager 212 and the switch 204. The example second hardware current sensor 224 is coupled to the switch 204, the current clamping circuit 222, and the analog-to-digital converter 210. The example analog-to-digital converter 210 is coupled to the microcontroller unit 202. The example firmware circuit breaker 216 is coupled to the configuration manager 212 and the switch 204.

In the illustrated example of FIG. 2, the example microcontroller unit 202 is a controller that controls one or more components included in the example power delivery controller 108 (e.g., the switch 204, the hardware circuit breaker 206, the hardware current limiter 208, etc.). In the example, the example microcontroller unit 202 is a controller. In alternative examples the microcontroller unit 202 may be implemented by one or more integrated circuits, logic circuits, microprocessors, graphics processing units (GPUs), digital signal processors (DSPs), or controllers from any desired family or manufacturer. Other examples disclosed herein include the microcontroller unit 202 integrated within a device (e.g., the power delivery controller 108). Additionally or alternatively, the microcontroller unit 202 may be implemented externally from the device (e.g., the power delivery controller 108) in one or more integrated circuits, logic circuits, microprocessors, GPUs, DSPs, or controllers from any desired family or manufacturer.

In the illustrated example of FIG. 2, configuration manager 212 detects that the external power supply 104 has connected to the internal power supply 110 via the power delivery controller 108. In response to detecting the external power supply 104 has connected to the internal power supply 110, the configuration manager 212 configures the hardware circuit breaker 206, the hardware current limiter 208, and/or the firmware circuit breaker 216 based on a default contract based on the specification of USB 2.0 or USB 3.0. The configuration manager 212 monitors the external power supply 104, at the CC node 228, to determine whether the external power supply 104 has reached a default contract voltage level (e.g., 5 volts). Once the external power supply 104 has reached the default contract voltage level, the configuration manager 212 monitors the internal power supply 110, at the CB node 232, for a first request to transition from a first voltage level (e.g., the default contract voltage level to a second voltage level).

In the illustrated example of FIG. 2, in response to detecting the first request from the internal power supply 110 to transition from the first voltage level to the second voltage level, the configuration manager 212 negotiates a new contract between the internal power supply 110 and the external power supply 104 based on the amount of power the external power supply 104 can source and the amount of power the internal power supply 110 can sink. The configuration manager 212 utilizes the second hardware current sensor 224 to monitor the current (e.g., monitor the current level) flowing from the external power supply 104 to the internal power supply 110. The configuration manager 212 configures one or more of the hardware circuit breaker 206, the hardware current limiter 208, and/or the firmware circuit breaker 216 for a first explicit contract that is based on the newly negotiated contract between the internal power supply 110 and the external power supply 104. The configuration manager 212 configures one or more of the hardware circuit breaker 206, the hardware current limiter 208, and/or the firmware circuit breaker 216 based on the SOA (e.g., based on safe operation) such that limiting the current flowing from the external power supply 104 to the internal power supply 110 does not cause the switch 204 to operate outside of the SOA. The configuration manager 212 monitors the external power supply 104, at the CC node 228 and the VBUS node 226, for the second voltage level negotiated in the new contract.

In the illustrated example of FIG. 2, in response to detecting the external power supply 104 has reached the second voltage, the configuration manager 212 starts a timer 234 including a time limit. When the configuration manager 212 determines that the timer 234 has reached the time limit, the configuration manager 212 configures one or more of the hardware circuit breaker 206, the hardware current limiter 208, and/or the firmware circuit breaker 216 for a second explicit contract that is based on the first explicit contract. After this, the configuration manager 212 monitors the internal power supply 110 for a second request to transition to a third voltage level.

In the illustrated example of FIG. 2, the power delivery controller 108 includes the configuration manager 212. The example configuration manager 212 is a hardware logic circuit that configures one or more of the hardware circuit breaker 206 and/or the hardware current limiter 208 and/or the firmware circuit breaker 216. In alternative examples the configuration manager 212 may be implemented by one or more integrated circuits, logic circuits, microprocessors, graphics processing units (GPUs), digital signal processors (DSPs), or controllers from any desired family or manufacturer. Other examples disclosed herein include the configuration manager 212 integrated within a device (e.g., the microcontroller unit 202). Additionally or alternatively, the configuration manager 212 may be implemented externally from the device (e.g., the microcontroller unit 202) in one or more integrated circuits, logic circuits, microprocessors, GPUs, DSPs, or controllers from any desired family or manufacturer. The configuration manager 212, in response to detecting that a first device (e.g., the external power supply 104) has connected to a second device (e.g., the internal power supply 110), via the power delivery controller 108, configures the hardware circuit breaker 206, the hardware current limiter 208, and/or the firmware circuit breaker 216 for the default contract according to the USB 2.0 or USB 3.0 specifications. The example configuration manager 212 monitors the internal power supply 110, at the CB node 232, for a first request to transition from a first voltage level to a second voltage level. In response to detecting the first request from the internal power supply 110, the configuration manager 212 determines the first voltage level and the second voltage level. The second voltage level includes an associated current level. The example configuration manager 212 determines whether the second voltage level and the associated current level will cause the switch 204 to operate outside the SOA of the switch 204 when limiting the current from the external power supply 104 to the internal power supply 110 with the hardware current limiter 208. In response to determining that the second voltage level and associated current level does not cause the switch 204 to operate outside the SOA of the switch 204 when limiting the current with the hardware current limiter 208, the configuration manager 212 configuration managers enables the hardware current limiter 208, enables the hardware circuit breaker 206, and disables the firmware circuit breaker 216. The configuration manager 212 additionally sets a first adjustable current threshold value for the hardware circuit breaker 206, a second adjustable current threshold value for the hardware current limiter 208 and a first duration threshold value for the hardware current limiter 208. In response to determining that the second voltage level and associated current level causes the switch 204 to operate outside the SOA of the switch 204 when limiting the current with the hardware current limiter 208, the configuration manager 212 disables the hardware current limiter 208, enables the hardware circuit breaker 206, and enables the firmware circuit breaker 216. The configuration manager 212 additionally sets a third adjustable current threshold value for the firmware circuit breaker 216, a second duration threshold value for the firmware circuit breaker 216, and the first adjustable current threshold value for the hardware circuit breaker 206. The configuration manager 212 sets the first adjustable current threshold value, the second adjustable current threshold value, the first duration threshold, the third adjustable current threshold value, and the second duration threshold by accessing the LUT 214 for configuration settings for the hardware circuit breaker 206, the hardware current limiter 208, and/or the firmware circuit breaker 216 based on the second voltage and the associated current level.

In the illustrated example, the microcontroller unit 202 includes the LUT 214. The LUT 214 includes example configuration settings for the configuration settings for the hardware circuit breaker 206, the hardware current limiter 208, and/or the firmware circuit breaker 216 based on voltage levels and associated current levels. For example, Table 1 below shows example configuration settings for the hardware circuit breaker 206, the hardware current limiter 208, and the firmware circuit breaker 216.

determines the current through the switch 204. Alternatively, the first hardware current sensor 218 may be a current mirror, a shunt resistor, a fiber optic sensor, a fluxgate transformer, etc. The example first hardware current sensor 218 monitors the current flowing from the drain terminal of the switch 204 to the source terminal of the switch 204 and provides the example analog comparator 220 with a voltage value that is directly related to the current flowing from the drain terminal of the switch 204 to the source terminal of the

TABLE 1

| Contract | Hardware Circuit Breaker 206 | Hardware Current Limiter 208 | Firmware circuit breaker 216 |
|---|---|---|---|
| $C_1$: V = 5 V, C = 3 A | Enabled<br>Current Threshold = 10 A<br>Timer = 0<br>Current Threshold After = 10 A | Enabled<br>Current Threshold = 3 A<br>Duration Threshold = 1 ms | Disabled<br>Current Threshold = N/A<br>Duration Threshold = N/A |
| $C_2$: V = 9 V, C = 3 A | Enabled<br>Current Threshold = 10 A<br>Timer = 250 ms<br>Current Threshold After = 5 A | Disabled<br>Current Threshold = N/A<br>Duration Threshold = N/A | Enabled<br>Current Threshold = 4 A<br>Duration Threshold = 3 ms |
| $C_3$: V = 15 V, C = 1.5 A | Enabled<br>Current Threshold = 5 A<br>Timer = 1000 ms<br>Current Threshold After = 3 A | Disabled<br>Current Threshold = N/A<br>Duration Threshold = N/A | Enabled<br>Current Threshold = 2 A<br>Duration Threshold = 2 ms |
| $C_4$: V = 20 V, C = 5 A | Enabled<br>Current Threshold = 20 A<br>Timer = 100 ms<br>Current Threshold After = 10 A | Disabled<br>Current Threshold = N/A<br>Duration Threshold = N/A | Enabled<br>Current Threshold = 6 A<br>Duration Threshold = 8 ms |
| $C_5$: V = 15 V, C = 3 A | Enabled<br>Current Threshold = 10 A<br>Timer = 250 ms<br>Current Threshold After = 5 A | Disabled<br>Current Threshold = N/A<br>Duration Threshold = N/A | Enabled<br>Current Threshold = 4 A<br>Duration Threshold = 2 ms |

In the example Table 1, the configuration settings for the hardware circuit breaker 206 include a first enable/disable setting, the first adjustable current threshold value, and a timer 234. The configuration settings for the hardware current limiter 208 include a second enable/disable setting, the second adjustable current threshold value, and the first duration threshold value. The configuration settings for the firmware circuit breaker 216 include a third enable/disable setting, the third adjustable current threshold value, and the second duration threshold value.

In the illustrated example of FIG. 2, the power delivery controller 108 includes the hardware circuit breaker 206. The hardware circuit breaker 206 includes the first hardware current sensor 218 and the analog comparator 220. The configuration manager 212 can enable and/or disable the hardware circuit breaker 206. The example hardware circuit breaker 206 is a hardware logic circuit that protects the switch 204 from current that is too large in magnitude for the switch 204 to withstand for any time. In the example, the hardware circuit breaker 206 includes the first hardware current sensor 218 and the analog comparator 220. In the example, the hardware circuit breaker 206 measures the current flowing through the switch 204 with the first hardware current sensor 218. The first hardware current sensor 218 provides the analog comparator 220 with a voltage level that is representative of the current flowing through the switch 204. The analog comparator 220 compares the voltage level obtained from the first hardware current sensor 218 and the first adjustable current threshold value. In response to the voltage level obtained from the first hardware current sensor 218 being larger in magnitude than the first adjustable current threshold value, the analog comparator 220 sends the switch 204 a hardware interrupt to open the switch 204 (e.g., open the power control device).

In the illustrated example of FIG. 2, the example first hardware current sensor 218 is a hardware logic circuit that switch 204. Alternatively, in some examples, the first hardware current sensor 218 senses the current through the switch 204 using a current mirroring circuit that utilizes a second switch (e.g., a MOSFET) comprised of the same or similar material as the switch 204. The first hardware current sensor 218 (e.g., the current mirroring circuit) generates a reference voltage that is reflective of the current flowing through the switch 204.

In the illustrated example of FIG. 2, the example hardware circuit breaker 206 includes the analog comparator 220. The analog comparator 220 is a hardware logic circuit that compares the first adjustable current threshold value with the voltage value generated by the first hardware current sensor 218. If the voltage value generated by the first hardware current sensor 218 is larger in magnitude than the first adjustable current threshold value, the analog comparator 220 generates a hardware interrupt that turns off the switch 204. However, if the voltage value generated by the first hardware current sensor 218 is smaller in magnitude than the first adjustable current threshold value, the analog comparator 220 does not generate a hardware interrupt and the hardware circuit breaker 206 continues to monitor the current flowing from the external power supply 104 to the internal power supply 110 with the first hardware current sensor 218.

In the illustrated example of FIG. 2, the example power delivery controller 108 includes the example hardware current limiter 208. The example hardware current limiter 208 includes the example current clamping circuit 222. In the example, the current clamping circuit 222 is a hardware logic circuit that controls the resistance of the switch 204 between the drain terminal and the source terminal while the switch 204 is conducting. In the example, the current clamping circuit 222 is an operational amplifier (opamp). The example current clamping circuit 222 outputs a voltage to the gate of the switch 204 that regulates the resistance from the drain terminal of the example switch 204 to the source terminal of the example switch 204. The current clamping circuit 222 may be a gate driver circuit. If the current clamping circuit 222 is a gate driver circuit, the current clamping circuit 222 controls the resistance of the switch 204 between the drain terminal and the source terminal while the switch 204 is conducting by changing the output impedance of the current clamping circuit 222. This either increases or reduces the amount of current flowing to the gate which is directly related to the mobility of charges flowing in the switch 204. These effects the resistance of the switch 204 between the drain terminal and the source terminal while the switch 204 is conducting. Alternatively, the current clamping circuit 222 may be a hardware logic circuit that controls the voltage between the gate terminal and the source terminal of the switch 204. The voltage between the gate terminal and the source terminal of the switch 204 is exponentially related to the resistance between the drain terminal and the source terminal of the switch 204 while the switch 204 is conducting. The current clamping circuit 222 compares a voltage value generated by the second hardware current sensor 224 to the second adjustable current threshold value. In response to the voltage value generated by the second hardware current sensor 224 exceeding the second adjustable current threshold value, the current clamping circuit 222 clamps the current through the switch 204 to the second adjustable current threshold value.

In the illustrated example of FIG. 2, the hardware current limiter 208 includes the second hardware current sensor 224. The example second hardware current sensor 224 is a current mirror. Alternatively, the second hardware current sensor 224 may be a shunt resistor, a fiber optic sensor, a fluxgate transformer, etc. The example second hardware current sensor 224 monitors the current flowing from the drain terminal of the switch 204 to the source terminal of the switch 204 and provides the example analog-to-digital converter 210 with a voltage value that is directly related to the current flowing from the drain terminal of the switch 204 to the source terminal of the switch 204. For example, the second hardware current sensor 224 senses the current through the switch 204 using a current mirroring circuit that utilizes a second switch (e.g., a MOSFET) comprised of the same or similar material as the switch 204. The second hardware current sensor 224 (e.g., the current mirroring circuit) generates a reference voltage that is reflective of the current flowing through the switch 204.

In the illustrated example of FIG. 2, the configuration manager 212 enables and/or disables the hardware current limiter 208. The hardware current limiter 208 controls the flow of current from the drain terminal to the source terminal of switch 204 with the current clamping circuit 222. The current clamping circuit 222 compares the second adjustable current threshold value to the current monitored by the second hardware current sensor 224. If the monitored current exceeds the second adjustable current threshold value, the current clamping circuit 222 clamps the current flowing through the switch 204 to the second adjustable current threshold value. If the current clamping circuit 222 clamps the current flowing through the switch 204 for the first duration threshold, the hardware current limiter 208 opens the switch 204 (e.g., opens the switch). If the monitored current does not exceed the second adjustable current threshold value, the hardware current limiter 208 continues to monitor the current through the switch 204 with the second hardware current sensor 224.

In the illustrated example of FIG. 2, the power delivery controller 108 includes the analog-to-digital converter 210. The example analog-to-digital converter 210 is a hardware circuit that converts signal from the analog domain to the digital domain. The example analog-to-digital converter 210 converts the voltage generated by the second hardware current sensor 224 into a digital signal and transmits the digital value for the voltage generated by the second hardware current sensor 224 to the microcontroller unit 202.

In the illustrated example, the microcontroller unit 202 includes the firmware circuit breaker 216. The example firmware circuit breaker 216 controls the current flowing from the drain terminal of the switch 204 to the source terminal of the switch 204. The example configuration manager 212 enables or disables the example firmware circuit breaker 216. When the firmware circuit breaker 216 is enabled, the example firmware circuit breaker 216 monitors the current flowing from the drain terminal to the source terminal of the switch 204 with the second hardware current sensor 224. The example firmware circuit breaker 216 compares the monitored current to the third adjustable current threshold value. If the monitored current is over the third adjustable current threshold value, the firmware circuit breaker 216 monitors the current from the drain terminal to the source terminal for the second duration threshold value. If the monitored current exceeds the third adjustable current threshold value for the second duration threshold value, the example firmware circuit breaker 216 turns off the switch 204. If not, the example firmware circuit breaker 216 continues to monitor the current flowing from the drain terminal to the source terminal of the switch 204 with the second hardware current sensor 224.

In the illustrated example of FIG. 2, the example firmware circuit breaker 216 operates by determining the current through the switch 204 on a rolling basis. The example firmware circuit breaker 216 subtracts from a place holder for the current through the switch 204 a saved current value for the oldest monitored current level. Next, the example firmware circuit breaker 216 saves a value for the monitored current from the second hardware current sensor 224 in a memory of the power delivery controller 108 at the location of the oldest monitored current level. The example firmware circuit breaker 216 adds the most recently monitored current level to the place holder for the current through the switch 204. The firmware circuit breaker 216 repeats this process for a predetermined number of times. Once the predetermined number of times has been completed, the firmware circuit breaker 216 determines if the place holder value for the current through the switch 204 is greater than the third adjustable current threshold value. If the current through the switch 204 is greater than the third adjustable current threshold value, the firmware circuit breaker 216 monitors the current through the switch 204 for the second duration threshold value. If the current through the switch 204 exceeds the third adjustable current threshold value for the second duration threshold value, the firmware circuit breaker 216 turns off the switch 204, if however, the current through the switch 204 does not exceed the third adjustable current threshold value for the second duration threshold value, the firmware circuit breaker 216 continues the process of monitoring the current through the switch 204.

In other examples, the firmware circuit breaker 216 monitors the current through the switch 204 and saves it as a saved current value. The firmware circuit breaker 216 repeats the monitoring of the current through the switch 204 for a predetermined number of times, each time adding the monitored current level to the saved current value. Once the predetermined number of times has been reached, the firmware circuit breaker 216 calculates the average of the saved current value by dividing the saved current value by the predetermined number of times. If the average saved current value exceeds the third adjustable current threshold value, the firmware circuit breaker 216 monitors the current through the switch 204 for the second duration threshold value. If the averaged saved current value exceeds the third adjustable current threshold value for the second duration threshold value, the firmware circuit breaker 216 turns off the switch 204, if however, the current through the switch 204 does not exceed the third adjustable current threshold value for the second duration threshold value, the firmware circuit breaker 216 continues the process of monitoring the current through the switch 204.

In other examples, the firmware circuit breaker 216 monitors the current through the switch 204 by monitoring the current through the switch 204 with the second hardware current sensor 224 for a predetermined number of times and saves the monitored current levels in a memory of the power delivery controller 108. After the current has been monitored for the predetermined number of times, the firmware circuit breaker 216 determines the average current through the switch 204 by dividing the sum of the saved monitored current levels by the predetermined number of times to monitor. If the average saved current value exceeds the third adjustable current threshold value, the firmware circuit breaker 216 monitors the current through the switch 204 for the second duration threshold value. If the averaged saved current value exceeds the third adjustable current threshold value for the second duration threshold value, the firmware circuit breaker 216 turns off the switch 204, if however, the current through the switch 204 does not exceed the third adjustable current threshold value for the second duration threshold value, the firmware circuit breaker 216 continues the process of monitoring the current through the switch 204 with the second hardware current sensor 224.

The first adjustable current threshold value, the second adjustable current threshold value, and the third adjustable current threshold value are dynamic and adjustable because the configuration manager 212 can configure the current threshold values during runtime without having to reprogram the hardware circuit breaker 206, the hardware current limiter 208, and/or the firmware circuit breaker 216. Rather, the configuration manager 212 outputs an analog or digital voltage to at least one of the analog comparator 220, the current clamping circuit 222, or the firmware circuit breaker 216 that is compared to at least one of the current reading from the first hardware current sensor 218 or the second hardware current sensor 224.

In the illustrated example of FIG. 2, the power delivery controller 108 controls the current flowing from the external power supply 104 to the internal power supply 110. Specifically, the configuration manager 212 detects that the external power supply 104 has connected to the internal power supply 110 via the power delivery controller 108. In response to detecting the connection between the external power supply 104 and the internal power supply 110, the configuration manager 212 configures one or more of the hardware circuit breaker 206, the hardware current limiter 208, or the firmware circuit breaker 216 for the default contract. In order to configure the hardware current limiter 208 for the default contract, the configuration manager 212 at least enables the hardware current limiter 208 and sets the second adjustable current threshold value to an advertised value (e.g., advertised current threshold value) for the default contract and sets the first duration threshold value to a first time value. In order to configure the firmware circuit breaker 216 for the default contract, the configuration manager 212 at least disables the firmware circuit breaker 216. In order to configure the hardware circuit breaker 206 for the default contract, the configuration manager 212 at least enables the hardware circuit breaker 206 and sets the first adjustable current threshold value to a first current value. The configuration manager 212 engages the default contract between the external power supply 104 and the internal power supply 110. The configuration manager 212 monitors the external power supply 104, at the CC node 228 and the VBUS node 226, to determine whether the external power supply 104 has reached a default contract voltage level (e.g., 5 volts). Once the external power supply 104 has reached the default contract voltage level, the configuration manager 212 monitors the internal power supply 110, at the CB node 232, for a first request to transition from a first voltage level (e.g., the default contract voltage level) to a second voltage level (e.g., 20 volts).

In the illustrated example, in response to a first request from the internal power supply 110 (e.g., a first device) to transition from a first voltage level to a second voltage level, the configuration manager 212 negotiates a new contract between the internal power supply 110 (e.g., the first device) and the external power supply 104 (e.g., the second device). For example, the first voltage level is the voltage level of the default contract (e.g., 5 volts) and the second voltage level is a voltage level greater than the default contract voltage level (e.g., greater than 5 volts, 15 volts, 20 volts, etc.). The configuration manager 212 continues to monitor the current flowing from the external power supply 104 to internal power supply 110 utilizing the second hardware current sensor 224 and the analog-to-digital converter 210. The configuration manager 212 configures one or more of the hardware circuit breaker 206, the hardware current limiter 208, or the firmware circuit breaker 216 for a first explicit contract, based on the new contract. In order to configure the hardware current limiter 208 for the first explicit contract, the configuration manager 212 at least disables the hardware current limiter 208. In order to configure the firmware circuit breaker 216 for the first explicit contract, the configuration manager 212 at least enables the firmware circuit breaker 216, sets the third adjustable current threshold value to a second current value, and sets the second duration threshold value to a second time value (e.g., the configuration manager 212 setting a second duration threshold value to a second time value). In order to configure the hardware circuit breaker 206 for the first explicit contract, the configuration manager 212 at least enables the hardware circuit breaker 206 and sets the first adjustable current threshold value to a third current value. The third current value is based on expected transients that may occur during the transition from the first voltage level to the second voltage level. The configuration manager 212 engages the first explicit contract. The configuration manager 212 monitors the external power supply 104, at the CC node 228 and the VBUS node 226, to determine whether the external power supply 104 has reached the second voltage level.

Once the external power supply 104 has reached the second voltage level, the configuration manager 212 starts a timer 234. The timer 234 is set to a first time limit. The first time limit is based on an amount of time it takes for the internal power supply 110 and the external power supply 104 to stabilize at steady state for the first explicit contract. The configuration manager 212 monitors the timer 234 and in response to the timer 234 reaching the first time limit, the configuration manager 212 configures one or more of the hardware circuit breaker 206, the hardware current limiter 208, or the firmware circuit breaker 216 for a second explicit contract. In order to configure the hardware circuit breaker 206 for the second explicit contract, the configuration manager 212 confirms that the hardware circuit breaker 206 is enabled and sets the first adjustable current threshold value to a fourth current value that is based on steady state values for the second voltage level. In order to configure the hardware current limiter 208 for the second explicit contract, the configuration manager 212 confirms that the hardware current limiter 208 is disabled. In order to configure the firmware circuit breaker 216 for the second explicit contract, the configuration manager 212 confirms that the firmware circuit breaker 216 is enabled, the second duration threshold value is set to the first time value, and the third adjustable current threshold value is set to the second current value. The configuration manager 212 engages the second explicit contract. The configuration manager 212 monitors the internal power supply 110, at the CB node 232, for a second request to transition from the second voltage level to a third voltage level.

Figure 3:
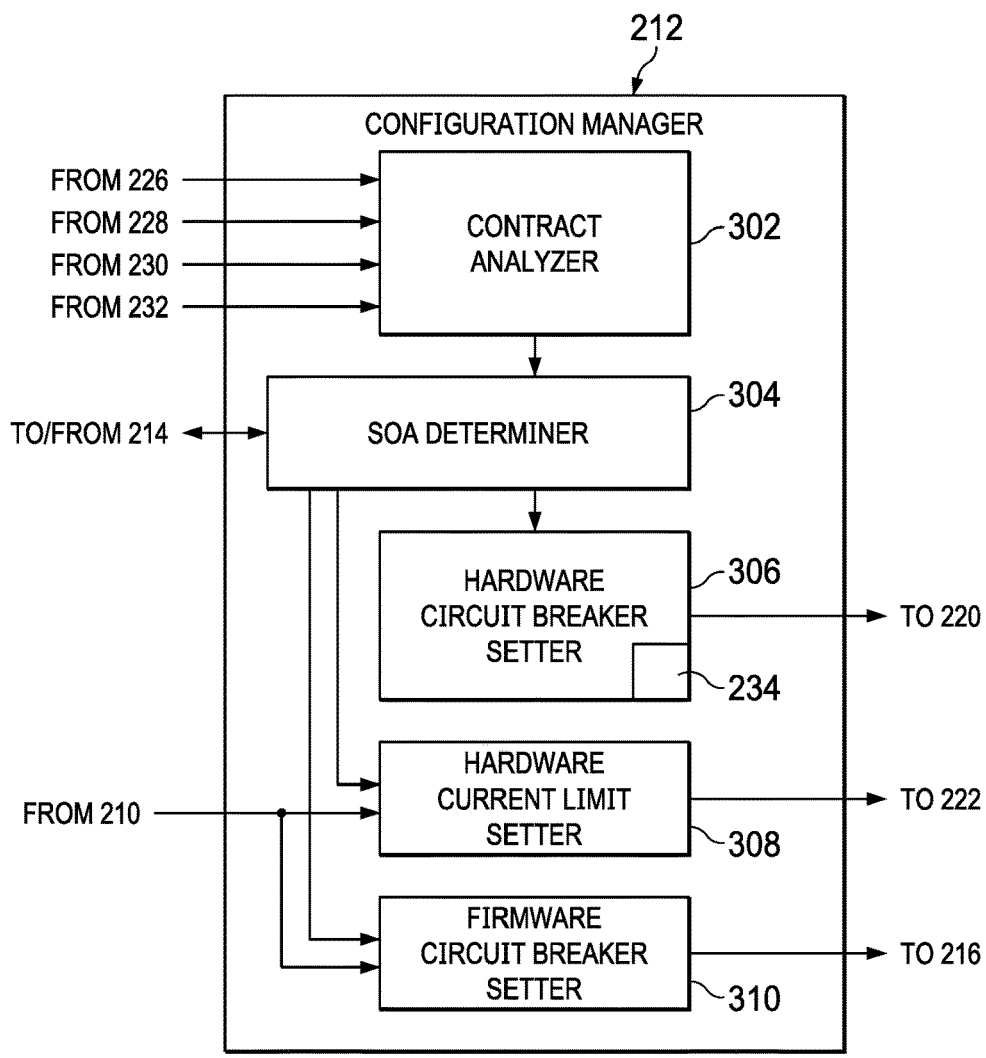
FIG. 3 is a schematic illustration showing additional details of the example configuration manager of FIG. 2.

FIG. 3 is an illustration of an example configuration manger 212 as shown in FIG. 2. In the example, the configuration manager 212 includes a contract analyzer 302, a safe operating area determiner 304, a hardware circuit breaker setter 306, a hardware current limit setter 308, and a firmware circuit breaker setter 310. The example hardware circuit breaker setter 306 includes a timer 234. In the example, the contract analyzer 302 is coupled to the external power supply 104 at the CC node 228 and the VBUS node 226, the internal power supply 110 at the CB node 232 and the PPHV node 230, and the SOA determiner 304. The example SOA determiner 304 is coupled to the LUT 214, the hardware circuit breaker setter 306, the hardware current limit setter 308, and the firmware circuit breaker setter 310. The hardware circuit breaker setter 306 is coupled to the analog comparator 220. The hardware current limit setter 308 is coupled to the current clamping circuit 222 and the analog-to-digital converter 210, the firmware circuit breaker setter 310 is coupled to the firmware circuit breaker 216 and the analog-to-digital converter 210.

In the example, the contract analyzer 302 determines whether a first device has connected to a second device. In response to detecting that a first device has connected to a second device, via the VBUS node 226 and the CC node 228, the contract analyzer 302 determines the default contract for the connection between the first device and the second device. The default contract is based on the USB 2.0 or the USB 3.0 specification. For example, the default contract is at 5 volts with a current of 1000 mA. The contract analyzer sends the current level and the voltage level to the SOA determiner 304. The SOA determiner 304 access the LUT 214 for one or more of the configuration settings for the hardware circuit breaker 206, the hardware current limiter 208, or the firmware circuit breaker 216. In the example, the configuration settings obtained from the LUT 214 are predefined configuration settings that are known to cause the switch 204 to operate within the SOA of the switch 204. In the example, the SOA determiner 304 sends the configuration settings for the hardware circuit breaker 206 to the hardware circuit breaker setter 306. The example SOA determiner 304 sends the configuration settings for the hardware current limiter 208 to the hardware current limit setter 308. In the example, the SOA determiner 304 sends the configuration settings for the firmware circuit breaker 216 to the firmware circuit breaker setter 310.

In the example, the hardware circuit breaker setter 306 sets the first adjustable current threshold value of the hardware circuit breaker 206 by writing a value to a register corresponding to the configuration settings obtained from the SOA determiner 304. For example, the hardware circuit breaker setter 306 sends a digital value (e.g., 00, 01, 10, 11, etc.) to the register corresponding to the first adjustable current threshold value. The digital value corresponds to the analog voltage level that the register outputs (e.g., 100 mV, 200 mV, 300 mV, 400, mV, etc.). Additionally, the hardware circuit breaker setter 306 enables or disables the hardware circuit breaker 206. In the example, the registers outputs an analog voltage value to the analog comparator 220 that is compared to the voltage value generated by the first hardware current sensor 218. Alternatively, in some examples, the hardware circuit breaker setter 306 sets the first adjustable current threshold value by sensing the current through the switch 204 using a current mirroring circuit that utilizes a second switch (e.g., a MOSFET) comprised of the same material as the switch 204. The current mirroring circuit generates a reference voltage that is reflective of the current flowing through the switch 204 and this is used to set the first adjustable current threshold value.

In the example, the hardware current limit setter 308 sets the second adjustable current threshold value and the first duration threshold value of the hardware current limiter 208 by writing a first value to a first register and second value to a second register. For example, the hardware current limit setter 308 sends a digital value (e.g., 00, 01, 10, 11, etc.) to the first register and the second register corresponding to the second adjustable current threshold value and the first duration threshold value of the hardware current limiter 208. The digital value corresponds to the analog voltage level that the first register and the second register output (e.g., 100 mV, 200 mV, 300 mV, 400, mV, etc.). Additionally, the hardware current limit setter 308 enables or disables the hardware current limiter 208. The first value and the second value correspond to the configuration settings obtained from the SOA determiner 304. In the example the first register outputs an analog voltage value that corresponds to the second adjustable current threshold value. In the example, when the current clamping circuit 222 clamps the current through the switch 204, the hardware current limit setter 308 monitors the current through the switch 204. If the current through the switch 204 exceeds the second adjustable current threshold value for the first duration threshold value, the hardware current limit setter 308 outputs a voltage value at the second register that corresponds to the first duration threshold value being reached. In response to receiving the voltage value from the second register, the current clamping circuit 222 opens the switch 204.

In the example, the firmware circuit breaker setter 310 sets the third adjustable current threshold value and the second duration threshold value of the firmware circuit breaker 216 by writing a third value to a third register and fourth value to a fourth register. For example, the firmware circuit breaker setter 310 sends a digital value (e.g., 00, 01, 10, 11, etc.) to the third register and the fourth register corresponding to the third adjustable current threshold value and the second duration threshold value of the firmware circuit breaker 216. The digital value corresponds to the analog voltage level that the third register and the fourth register output (e.g., 100 mV, 200 mV, 300 mV, 400, mV, etc.). Additionally, the firmware circuit breaker setter 310 enables or disables the firmware circuit breaker 216. The third value and the fourth value correspond to the configuration settings obtained from the SOA determiner 304. In the example the third register outputs a digital voltage value that corresponds to the third adjustable current threshold value. In the example, the fourth register outputs a digital voltage value that corresponds to the second duration threshold value. When the current through the switch 204 exceeds the third adjustable current threshold value, the firmware circuit breaker 216 monitors the current through the switch 204 for the second duration threshold value. In response to the second duration threshold being reached, the firmware circuit breaker 216 opens the switch 204.

In the example, the contract analyzer 302 determines what the power delivery capabilities of the external power supply 104 are. For example, the external power supply 104 transmits the power capabilities of the external power supply 104 to the contract analyzer 302. In the example, the contract analyzer 302 monitors the internal power supply 110 for the first request for a transition from the first voltage level to the second voltage level. In response to the first request for a transition from a first voltage level to a second voltage level, the contract analyzer 302 negotiates the first explicit contract between the first device and the second device. The hardware current limit setter 308 and the firmware circuit breaker setter 310 monitor the current via the analog-to-digital converter 210. In response to detecting, at the CC node 228, the external power supply 104 has reached the second voltage level, the contract analyzer 302 sends the second voltage level and the associated current level to the SOA determiner. In some examples, the SOA determiner accesses the LUT 214 for configuration settings based on the second voltage level and associated current value. In other examples, the SOA determiner analyzes the second voltage level and the associated current value and determines based on a predetermined SOA of the switch 204, whether the second voltage level and associated current value will cause the switch 204 to operate outside the SOA of the MOSFET when limiting the current through the switch 204 with the hardware current limiter 208. If limiting the current with the hardware current limiter 208 does not cause the switch 204 to operate outside the SOA of the switch 204, the SOA determiner 304 sends configuration settings to the firmware circuit breaker setter 310 to disable to firmware circuit breaker 216. Additionally, the SOA determiner 304 sends configuration settings to the hardware current limit setter 308 according to the second voltage level and associated current value. The SOA determiner 304 also send configuration settings to the hardware circuit breaker setter 306 according to the steady state value of current that the switch 204 can withstand without being damaged, the transient value of current the switch 204 can withstand without being damaged, and the timer 234 including a first time limit. In response to receiving the configuration settings for the hardware circuit breaker 206, the hardware circuit breaker setter 306 sets a register to a first analog voltage value corresponding to the transient current value that the switch 204 can withstand without being damaged. The hardware circuit breaker setter 306 sets the timer 234 and monitors the timer 234 for the first time limit. When the first time limit has been reached, the hardware circuit breaker setter 306 sets the register a second analog voltage value corresponding to the steady state value of current the switch 204 can withstand without being damaged. In the example the hardware current limit setter 308 sets a second register to a second analog voltage value corresponding to the second adjustable current threshold value and a third register to a third analog voltage value corresponding to the first duration threshold value. In the example, when the current clamping circuit 222 clamps the current through the switch 204, the hardware current limit setter 308 monitors the current through the switch 204. If the current through the switch 204 exceeds the second adjustable current threshold value for the first duration threshold value, the hardware current limit setter 308 outputs the third analog voltage value at the third register that corresponds to the first duration threshold value being reached. In response to receiving the third analog voltage value from the third register, the current clamping circuit 222 opens the switch 204.

In the example, the firmware circuit breaker setter 310 sets the third adjustable current threshold value and the second duration threshold value of the firmware circuit breaker 216 by writing a fourth analog voltage value to a fourth register and fifth analog value to a fifth register. In the example the fourth register outputs a digital voltage value that corresponds to the third adjustable current threshold value. In the example, the fifth register outputs a digital voltage value that corresponds to the second duration threshold value. When the current through the switch 204 exceeds the third adjustable current threshold value, the firmware circuit breaker 216 monitors the current through the switch 204 for the second duration threshold value. In response to the second duration threshold being reached, the firmware circuit breaker 216 opens the switch 204.

FIG. 4 is an example timing diagram 400 including a current plot 402, a voltage plot 404, an enable plot 405, a time 406 ($T_1$), a time 408 ($T_2$), a time 410 ($T_3$), a time 412 ($T_4$), a time 413 ($T_5$), a time 414 ($T_6$), an example first enable curve 415, an example voltage curve 416, an example second enable curve 417, an example current curve 418, an example first adjustable current threshold value curve 420, an example second adjustable current threshold value curve 422, and an example third adjustable current threshold value curve 424. The timing diagram 400 of FIG. 4 illustrate current control when implementing the configuration manager of FIGS. 2 and 3. The timing diagram 400 begins at the time 406 (e.g., $T_1$) where a first device (e.g., the internal power supply 110, the host device 102) is not connected to any other devices. In the timing diagram 400, the current plot 402 represents the current threshold values for the hardware circuit breaker 206, the hardware current limiter 208, the firmware circuit breaker 216 and the current flowing through the switch 204 (e.g., the example current curve 418). In the timing diagram 400, the voltage plot 404 represents a transition between voltage levels. The example enable plot 405 illustrates different enable values for the hardware current limiter 208 and the firmware circuit breaker 216. The example first enable curve 415 represents the enable/disable values for the hardware current limiter 208. The example second enable curve 417 represents the enable/disable values for the firmware circuit breaker 216. The example voltage curve 416 is the voltage level at the PPHV node 230. At time 406 ($T_1$) no devices are connected to the first device. The example first enable curve 415 is at a value of 1, the example voltage curve 416 is at a voltage level of 0 volts, the example second enable curve 417 is at a value of 0, the example current curve 418 is at a current level of 0 amps, the example first adjustable current threshold value curve 420 is at a current value of 8 amps, the example second adjustable current threshold value curve 422 is at a current value of 3 amps with a corresponding first duration threshold value of 1 ms, and the example third adjustable current threshold value curve 424 is at a current value of 0 amps with a corresponding second duration threshold value of 0 ms. At the time 408 (e.g., $T_2$) a first device (e.g., the internal power supply 110, the host device 102) connects to a second device (e.g., the external power supply 104). At the time 408 ($T_2$), the configuration manager 212 configures one or more of the hardware circuit breaker 206, the hardware current limiter 208, or the firmware circuit breaker 216 for the default contract between the first device (e.g., the internal power supply 110, the host device 102) and the second device (e.g., the external power supply 104). The example first enable curve 415 is at a value of 1, the example voltage curve 416 is at a voltage level of 0 volts, the example second enable curve 417 is at a value of 0, the example current curve 418 is at a current level of 0 amps, the example first adjustable current threshold value curve 420 is at a current value of 8 amps, the example second adjustable current threshold value curve 422 is at a current value of 3 amps with a corresponding first duration threshold value of 1 ms, and the example third adjustable current threshold value curve 424 is at a current value of 0 amps with a corresponding second duration threshold value of 0 ms.

After the time 408 ($T_2$), the voltage level on the example voltage curve 416 transitions from 0 volts to the voltage level of the default contract (e.g., 5 volts). At time 408 ($T_2$), the configuration manager 212 monitors the first device (e.g., the internal power supply 110, the host device 102) for a first request to transition from a first voltage level (e.g., the default contract voltage level) to a second voltage level (e.g., a voltage level greater than 5 volts). At the time 410 ($T_3$), the configuration manager 212 detects a first request from the first device (e.g., the internal power supply 110, the host device 102) to transition from the first voltage level to the second voltage level. At the time 410 ($T_3$), the example first enable curve 415 is at a value of 1 and transitions to a value of 0, the example voltage curve 416 is at a voltage level of 5 volts, the example second enable curve 417 is at a value of 0 and transitions to a value of 1, the example current curve 418 is at a current level of 0 amps, the example first adjustable current threshold value curve 420 is at a current value of 8 amps, the example second adjustable current threshold value curve 422 is at a current value of 3 amps with a corresponding first duration threshold value of 1 ms, and the example third adjustable current threshold value curve 424 is at a current value of 0 amps with a corresponding second duration threshold value of 0 ms.

In response to detecting the first request, the contract analyzer 302 negotiates a new contract between the first device (e.g., the internal power supply 110, the host device 102) and the second device (e.g., the external power supply 104). At time 410 (e.g., $T_3$), hardware circuit breaker setter 306 configures the hardware circuit breaker 206 for a first explicit contract, the hardware current limit setter 308 configures the hardware current limiter 208 for the first explicit contract, and the firmware circuit breaker setter 310 configures the firmware circuit breaker 216 for the first explicit contract. The first explicit contract is based on the new contract. In other examples, the first explicit contract is based on the new contract and expected transients that occur when transitioning from the first voltage level to the second voltage level. At the time 410 ($T_3$), the example first enable curve 415 is at a value of 1 and transitions to a value of 0; the example voltage curve 416 is at a voltage level of 5 volts and begins to transition from the first voltage level (e.g., 5 volts) to the second voltage level (e.g., 20 volts); the example second enable curve 417 is at a value of 0 and transitions to a value of 1; the example current curve 418 is at a current level of 0 amps; the example first adjustable current threshold value curve 420 changes from a current value of 8 amps to a current value of 17 amps; the example second adjustable current threshold value curve 422 changes from a current value of 3 amps with a corresponding first duration threshold value of 1 ms to a current value of 0 amps with a corresponding first duration threshold value of 0 ms; and the example third adjustable current threshold value curve 424 changes from a current value of 0 amps with a corresponding second duration threshold value of 0 ms to a current value of 6 amps with a corresponding second duration threshold value of 8 ms.

In the timing diagram 400, at the time 412 ($T_4$), the second device has reached the second voltage level. The contract analyzer 302 detects, at the CC node 228, that the second device (e.g., the external power supply 104) has reached the second voltage level. At the time 412 (e.g., $T_4$), the hardware circuit breaker setter 306 starts a timer 234 that includes (e.g., including) a time limit (e.g., 40 ms). The time limit represents the amount of time needed for the transition from the first voltage level to the second voltage level to stabilize at steady state. Upon the second device reaching the second voltage level, the first device may additionally supply power to sub-devices and/or sub-circuits within the first device. For example, the first device and/or sub-devices in the first device use soft start controllers to charge a 600 µF capacitor from 0 volts to 20 volts in 1 ms. At the time 412 the example first enable curve 415 is at a value of 0; the example voltage curve 416 is at a voltage level of 20 volts; the example second enable curve 417 is at a value of 1; the example current curve 418 changes from a current value of 0 amps to a current value of 12 amps; the example first adjustable current threshold value curve 420 is at a current value of 17 amps; the example second adjustable current threshold value curve 422 is at a current value of 0 amps with a corresponding first duration threshold value of 0 ms; and the example third adjustable current threshold value curve 424 is at a current value of 6 amps with a corresponding second duration threshold value of 8 ms.

In the timing diagram 400, at the time 413 ($T_5$), the first device and/or sub-devices in the first device using soft start controllers have charged the 600 µF capacitor to 20 volts. At the time 413 (e.g., $T_5$), the example first enable curve 415 is at a value of 0; the example voltage curve 416 is at a voltage level of 20 volts; the example second enable curve 417 is at a value of 1; the example current curve 418 changes from a current value of 12 amps to a current value of 3 amps; the example first adjustable current threshold value curve 420 is at a current value of 17 amps; the example second adjustable current threshold value curve 422 is at a current value of 0 amps with a corresponding first duration threshold value of 0 ms; and the example third adjustable current threshold value curve 424 is at a current value of 6 amps with a corresponding second duration threshold value of 8 ms. The duration of the transient (e.g., the difference between time 412 ($T_4$) and time 413 ($T_5$)) and the peak value of the transient (e.g., 12 amps) are based on the application. While the example current curve 418 and duration of the transient are based on a controlled, soft start of the 600 µF capacitor, and thus a square waveform, in other examples, the duration of the transient may be longer or shorter than that illustrated in FIG. 4, the peak value of the transient may be higher or lower than that illustrated in FIG. 4, and the current curve 418 may be a different shape than a square waveform. For example, in some examples, the example current curve 418 is an uncontrolled pulse waveform.

At time 414 (e.g., $T_6$), the timer 234 reaches the time limit. In response to the timer 234 reaching the time limit, the hardware circuit breaker setter 306 configures the hardware circuit breaker 206 for a second explicit contract, the hardware current limit setter 308 configures the hardware current limiter 208 for the second explicit contract, and the firmware circuit breaker setter 310 configures the firmware circuit breaker 216 for the second explicit contract. The second explicit contract is based on the first explicit contract. Additionally or alternatively, the second explicit contract is based on the expected steady state values for the second voltage level. At the time 414 ($T_6$), the example first enable curve 415 is at a value of 0; the example voltage curve 416 is at a voltage level of 20 volts; the example second enable curve 417 is at a value of 1; the example current curve 418 is at a current level of 3 amps; the example first adjustable current threshold value curve 420 changes from a current value of 17 amps to a current value of 8 amps; the example second adjustable current threshold value curve 422 is at a current value of 0 amps with a corresponding first duration threshold value of 0 ms; and the example third adjustable current threshold value curve 424 is at a current value of 6 amps with a corresponding second duration threshold value of 8 ms.

Continuing from the time 414, the contract analyzer 302 monitors the first device (e.g., the internal power supply 110, the host device 102), at the CC node 228 and the CB node 232, for a second request to transition to a third voltage level.

While an example timing diagram illustrating an example function of the configuration manager 212 is described in conjunction with FIG. 4, other example timing diagrams may illustrate an alternative example function of the configuration manager 212. For example, in another example timing diagram, the current curve 418 may include a 1 amp offset from the time 406 ($T_1$) until the time 412 ($T_4$). In the other example timing diagram, the second adjustable current threshold value curve 422 may be at a current value of 3 amps with a corresponding first duration threshold value of 1 ms, but the firmware circuit breaker 216 may be disabled by the configuration manager 212. In the other example timing diagram, the third adjustable current threshold value curve 424 may be at a current value of 6 amps with a corresponding second duration threshold value of 8 ms, but the firmware circuit breaker 216 may be disabled by the configuration manager 212.

While an example manner of implementing the configuration manager of FIG. 2 is illustrated in FIG. 3, one or more of the elements, processes and/or devices illustrated in FIG. 3 may be combined, divided, re-arranged, omitted, eliminated and/or implemented in any other way. Further, the example contract analyzer 302, the example safe operating area determiner 304, the example hardware circuit breaker setter 306, the example hardware current limit setter 308, the example firmware circuit breaker setter 310 and/or, more generally, the example configuration manager 212 of FIG. 3 may be implemented by hardware, software, firmware and/or any combination of hardware, software and/or firmware. Thus, for example, any of the example contract analyzer 302, the example safe operating area determiner 304, the example hardware circuit breaker setter 306, the example hardware current limit setter 308, the example firmware circuit breaker setter 310 and/or, more generally, the example configuration manager 212 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example hardware circuit breaker 206, the example contract analyzer 302, the example safe operating area determiner 304, the example hardware circuit breaker setter 306, the example hardware current limit setter 308, the example firmware circuit breaker setter 310 is/are hereby expressly defined to include a non-transitory computer readable storage device or storage disk such as a memory, a digital versatile disk (DVD), a compact disk (CD), a Blu-ray disk, etc. including the software and/or firmware. Further still, the example configuration manager of FIG. 3 may include one or more elements, processes and/or devices in addition to, or instead of, those illustrated in FIG. 3, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 5:
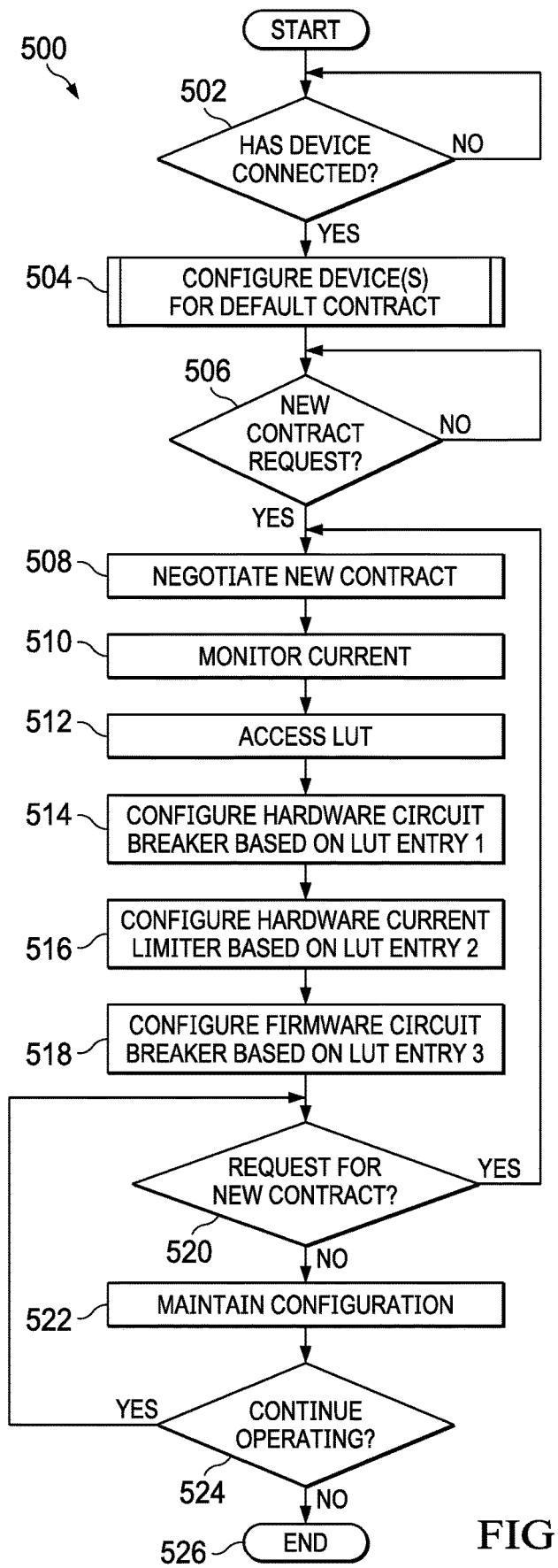
FIG. 5 is a flowchart representative of machine readable instructions that may be executed to implement the configuration manager of FIGS. 2 and 3 to control the flow of current between a first device and a second device when accessing a Look Up Table (LUT).
Figure 6:
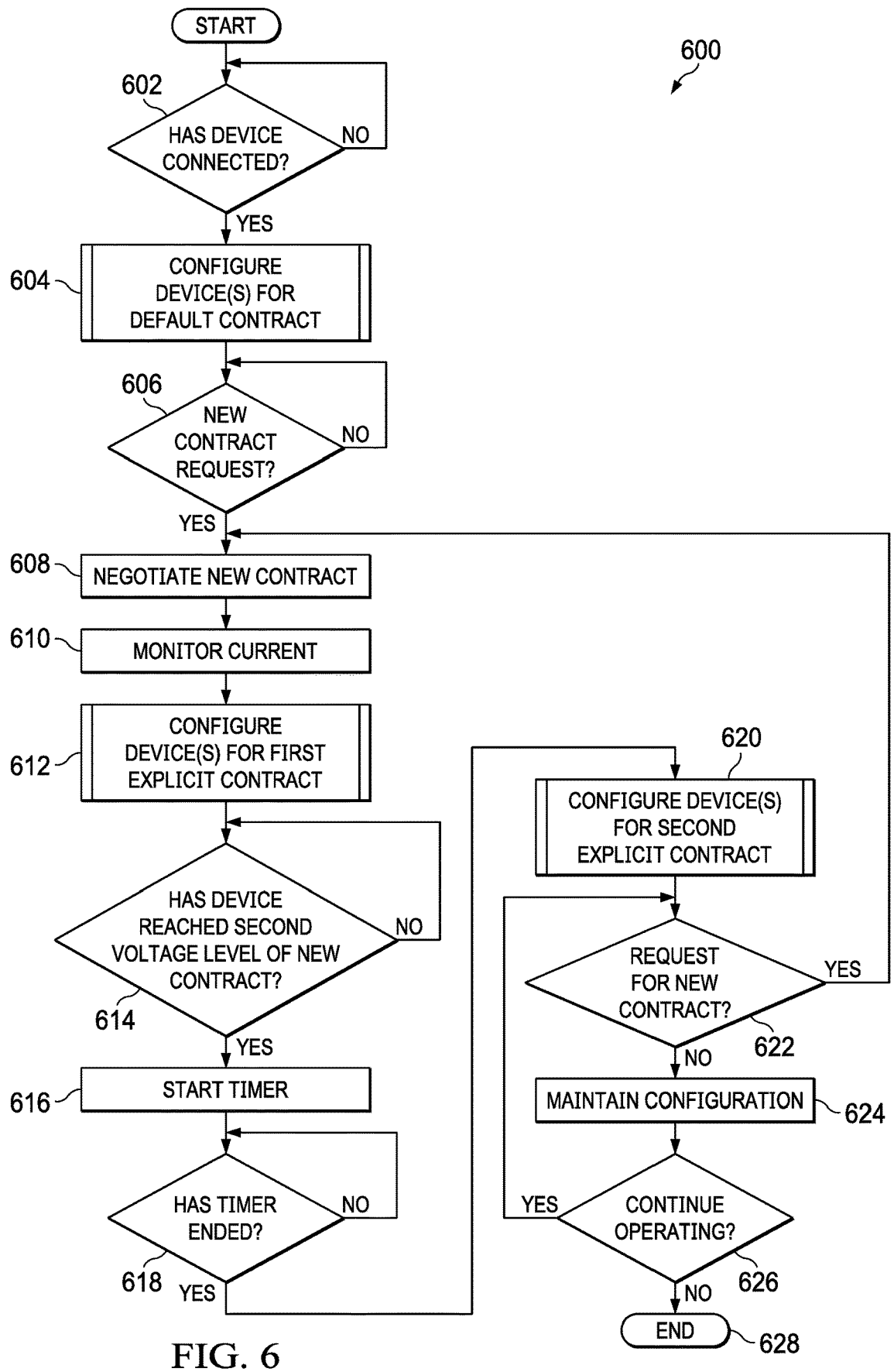
FIG. 6 is a flowchart representative of machine readable instructions that may be executed to implement the configuration manager of FIGS. 2 and 3 to control the flow of current between a first device and a second device.

A flowchart representative of example hardware logic, machine readable instructions, hardware implemented state machines, and/or any combination thereof for implementing the configuration manager 212 of FIGS. 2 and/or 3 is shown in FIGS. 5 and 6. The machine readable instructions may be one or more executable programs or portion(s) of an executable program for execution by a computer processor such as the controller (e.g., the microcontroller unit 202, the power delivery controller 108, or the configuration manager 212) discussed above in connection with FIGS. 1-3. The program may be embodied in software stored on a non-transitory computer readable storage medium such as a CD-ROM, a floppy disk, a hard drive, a DVD, a Blu-ray disk, or a memory associated with the controller (e.g., the microcontroller unit 202, the power delivery controller 108, or the configuration manager 212), but the entire program and/or parts thereof could alternatively be executed by a device other than the controller (e.g., the microcontroller unit 202, the power delivery controller 108, or the configuration manager 212) and/or embodied in firmware or dedicated hardware. Further, although the example program is described with reference to the flowchart illustrated in FIGS. 5 and 6, many other methods of implementing the example configuration manager 212 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, etc. in order to make them directly readable and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein. In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

As mentioned above, the example processes of FIGS. 5, 6, 7, 8, and 9 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one of A and at least one of B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least A, (2) at least B, and (3) at least A and at least B. Similarly, as used herein in the context of describing the performance or execution of processes, instructions, actions, activities and/or steps, the phrase "at least one of A or B" is intended to refer to implementations including any of (1) at least A, (2) at least B, and (3) at least A and at least B.

FIG. 5 is a flowchart representative of machine readable instructions that may be executed to implement the configuration manager 212 of FIGS. 2 and 3 to control the flow of current between a first device (e.g., the internal power supply 110, the host device 102) and a second device (e.g., the external power supply 104) when accessing the LUT 214. The program 500 of FIG. 5 starts at block 502 where the contract analyzer 302 of FIG. 3 determines whether the first device has connected to a second device. If the contract analyzer 302 determines that first device has connected to a second device via the power delivery controller 108 at the CC node 228 and the VBUS node 226 (block 502: YES), the program 500 proceeds to block 504. If the contract analyzer 302 determines that the first device has not connected to a second device (block 502: NO), the contract analyzer 302 continues to monitor the CC node 228 and the VBUS node 226 to determine whether the first device has connected to a second device. The first device is, for example, the internal power supply 110 of FIGS. 1 and 2, and the second device is, for example, the external power supply of FIGS. 1 and 2. Block 502 of FIG. 5 corresponds to the time 408 ($T_2$) of FIG. 4. At block 502 and the time 408 ($T_2$) the example voltage curve 416 is at a voltage level of 0 volts, the example current curve 418 is at a current level of 0 amps, the example first adjustable current threshold value curve 420 is at a current value of 8 amps, the example second adjustable current threshold value curve 422 is at a current value of 3 amps with a corresponding first duration threshold value of 1 ms, and the example third adjustable current threshold value curve 424 is at a current value of 0 amps with a corresponding second duration threshold value of 0 ms.

At block 504, the configuration manager 212 configures devices for a default contract between the first device and the second device. For example, the hardware circuit breaker setter 306 configures the hardware circuit breaker 206, the hardware current limit setter 308 configures the hardware current limiter 208, and the firmware circuit breaker setter 310 configures the firmware circuit breaker 216. Block 504 of FIG. 5 corresponds to the time 408 ($T_2$) of FIG. 4. At block 504 and the time 408 ($T_2$), the example voltage curve 416 is at a voltage level of 0 volts and begins to transition from 0 volts to the default contract voltage level (e.g., 5 volts); the example current curve 418 is at a current level of 0 amps; the example first adjustable current threshold value curve 420 is at a current value of 8 amps; the example second adjustable current threshold value curve 422 is at a current value of 3 amps with a corresponding first duration threshold value of 1 ms; and the example third adjustable current threshold value curve 424 is at a current value of 0 amps with a corresponding second duration threshold value of 0 ms.

In the illustrated example of FIG. 5, at block 506, the contract analyzer 302 monitors the first device for a first request to transition from a first voltage level to a second voltage level. If the contract analyzer 302 receives the first request from the first device to transition from the first voltage level to a second voltage level (block 506: YES) contract analyzer 302, at block 508, negotiates a new contract between the first device and the second device. The new contract is based on the amount of power the first device and/or the second device can source and/or sink. If, however, the contract analyzer 302 does not receive the first request from the first device to transition from the first voltage level to the second voltage level (block 506: NO), the contract analyzer 302 continues to monitor the first device for the first request from the first device to transition from the first voltage level to the second voltage level at block 506. At block 510 the hardware current limit setter 308 and the firmware circuit breaker setter 310 monitors the current flowing between the first device and the second device (e.g., monitor a current) utilizing the second hardware current sensor 224. At block 512 the SOA determiner 304 accesses the LUT 214 to determine configuration settings for the hardware circuit breaker 206, the hardware current limiter 208, and the firmware circuit breaker 216.

At block 514 of FIG. 5, the configuration manager 212 configures the hardware circuit breaker 206. More specifically, at block 514, the hardware circuit breaker setter 306 accesses the first configuration settings in an entry in the LUT 214 corresponding to the first explicit contract. At block 516 of FIG. 5, the configuration manager 212 configures the hardware current limiter 208. More specifically, at block 516, the hardware current limit setter 308 accesses the second configuration settings in the entry in the LUT 214 corresponding to the first explicit contract. At block 518 of FIG. 5, the configuration manager 212 configures the firmware circuit breaker setter 310. More specifically, at block 518, the firmware circuit breaker setter 310 accesses the third configuration settings in the entry in the LUT 214 corresponding to the first explicit contract.

In the illustrated example, the contract analyzer 302, at block 520, monitors the first device for a second request for a new contract (e.g., a third contract). If the contract analyzer 302 detects a second request for a new contract (block 520: YES), the contract analyzer 302 negotiates the new contract between the first device and the second device at block 508. If the contract analyzer 302, does not detect a second request for a new contract (block 520: NO), the configuration manager 212 maintains the present configuration of the devices at block 522 (e.g., the hardware circuit breaker 206, the hardware current limiter 208, the firmware circuit breaker 216).

At block 524, the contract analyzer 302 determines whether to continue operating. In some examples, the contract analyzer 302 stops operating because the power delivery controller 108 is no longer receiving power. In other examples, the contract analyzer 302 stops operating to save power. In other examples, the contract analyzer 302 stops operating because the first device is no longer connected to a second device. If the contract analyzer 302 determines, at block 524, to stop operating (block 524: NO) the program 500 ends at block 526. However, if the contract analyzer 302 determines to continue operating (block 524: YES), the contract analyzer 302 monitors the first device for a second request for a new contract at block 520.

FIG. 6 is a flowchart representative of machine readable instructions that may be executed to implement the configuration manager 212 of FIGS. 2 and 3 to control the flow of current between a first device (e.g., the internal power supply 110, the host device 102) and a second device (e.g., the external power supply 104). The program 600 of FIG. 6 starts at block 602 where the contract analyzer 302 of FIG. 3 determines whether the first device has connected to a second device via the power delivery controller 108 at the CC node 228 and the VBUS node 226. If the contract analyzer 302 determines that first device has connected to a second device via the power delivery controller 108 at the CC node 228 and the VBUS node 226 (block 602: YES), the program 600 proceeds to block 604. If the contract analyzer 302 determines that the first device has not connected to a second device (block 602: NO), the contract analyzer 302 continues to monitor the CC node 228 and the VBUS node 226 to determine whether the first device has connected to a second device. The first device is, for example, the internal power supply 110 of FIGS. 1 and 2, and the second device is, for example, the external power supply 104 of FIGS. 1 and 2. Block 602 of FIG. 6 corresponds to the time 408 ($T_2$) of FIG. 4. At block 602 and the time 408 ($T_2$) the example voltage curve 416 is at a voltage level of 0 volts, the example current curve 418 is at a current level of 0 amps, the example first adjustable current threshold value curve 420 is at a current value of 8 amps, the example second adjustable current threshold value curve 422 is at a current value of 3 amps with a corresponding first duration threshold value of 1 ms, and the example third adjustable current threshold value curve 424 is at a current value of 0 amps with a corresponding second duration threshold value of 0 ms.

At block 604, the configuration manager 212 configures devices for a default contract between the first device and the second device. For example, the hardware circuit breaker setter 306 configures the hardware circuit breaker 206, the hardware current limit setter 308 configures the hardware current limiter 208, and the firmware circuit breaker setter 310 configures the firmware circuit breaker 216. Block 604 of FIG. 6 corresponds to the time 408 ($T_2$) of FIG. 4. At block 604 and the time 408 ($T_2$), the example voltage curve 416 is at a voltage level of 0 volts and begins to transition from 0 volts to the default contract voltage level (e.g., 5 volts); the example current curve 418 is at a current level of 0 amps; the example first adjustable current threshold value curve 420 is at a current value of 8 amps; the example second adjustable current threshold value curve 422 is at a current value of 3 amps with a corresponding first duration threshold value of 1 ms; and the example third adjustable current threshold value curve 424 is at a current value of 0 amps with a corresponding second duration threshold value of 0 ms.

In the illustrated example of FIG. 6, at block 606, the contract analyzer 302 monitors the first device for a first request to transition from a first voltage level to a second voltage level. If the contract analyzer 302 receives the first request from the first device to transition from the first voltage level to a second voltage level (block 606: YES) contract analyzer 302, at block 608, negotiates a new contract between the first device and the second device. The new contract is based on the amount of power the first device and/or the second device can source and/or sink. If, however, the contract analyzer 302 does not receive the first request from the first device to transition from the first voltage level to the second voltage level (block 606: NO), the contract analyzer 302 continues to monitor the first device for the first request from the first device to transition from the first voltage level to the second voltage level at block 606. At block 610 the hardware current limit setter 308 and the firmware circuit breaker setter 310 monitors the current flowing between the first device and the second device (e.g., monitor a current) utilizing the second hardware current sensor 224.

At block 612, the configuration manager 212 configures the devices for a first explicit contract between the first device and the second device. For example, the hardware circuit breaker setter 306 configures the hardware circuit breaker 206 for the first explicit contract, the hardware current limit setter 308 configures the hardware current limiter 208 for the first explicit contract, and the firmware circuit breaker setter 310 configures the firmware circuit breaker 216 for the first explicit contract. Block 612 of FIG. 6 corresponds to the time 410 ($T_3$) of FIG. 4. At block 612 and the time 410 ($T_3$), the example voltage curve 416 is at a voltage level of 5 volts and begins to transition from the first voltage level (e.g., 5 volts) to the second voltage level (e.g., 20 volts); the example current curve 418 is at a current level of 0 amps; the example first adjustable current threshold value curve 420 changes from a current value of 8 amps to a current value of 17 amps; the example second adjustable current threshold value curve 422 changes from a current value of 3 amps with a corresponding first duration threshold value of 1 ms to a current value of 0 amps with a corresponding first duration threshold value of 0 ms; and the example third adjustable current threshold value curve 424 changes from a current value of 0 amps with a corresponding second duration threshold value of 0 ms to a current value of 6 amps with a corresponding second duration threshold value of 8 ms.

In the illustrated example, the contract analyzer 302, at block 614 monitors the second device, at the CC node 228, for the second voltage level negotiated in the new contract. If the contract analyzer 302 detects that the second device has reached the second voltage level (block 614: YES), the hardware circuit breaker setter 306 starts a timer 234 at block 616 (e.g., at the time 412 ($T_4$). If, however, the contract analyzer 302 does not detect that the second device has reached the second voltage level (block 614: NO) the contract analyzer 302 continues to monitor the second device, at the CC node 228, for the second voltage level negotiated in the new contract. Block 616 of FIG. 6 corresponds to the time 412 ($T_4$) of FIG. 4. At block 616 and the time 412 the example voltage curve 416 is at a voltage level of 20 volts; the example current curve 418 is at a current level of 0 amps and begins to transition to a steady state current level, reaching a peak of 12 amps; the example first adjustable current threshold value curve 420 is at a current value of 17 amps; the example second adjustable current threshold value curve 422 is at a current value of 0 amps with a corresponding first duration threshold value of 0 ms; and the example third adjustable current threshold value curve 424 is at a current value of 6 amps with a corresponding second duration threshold value of 8 ms.

At block 618, the hardware circuit breaker setter 306 monitors the timer 234 to determine whether the timer 234 has reached the time limit. If the hardware circuit breaker setter 306 determines that the timer 234 has reached the time limit (block 618: YES), the configuration manager 212 configures the devices for a second explicit contract between the first device and the second device at block 620. For example, the hardware circuit breaker setter 306 configures the hardware circuit breaker 206 for the second explicit contract, the hardware current limit setter 308 configures the hardware current limiter 208 for the second explicit contract, and the firmware circuit breaker setter 310 configures the firmware circuit breaker 216 for the second explicit contract. If, however, the hardware circuit breaker setter 306 determines that the timer 234 has not reached the time limit (block 618: NO), the hardware circuit breaker setter 306 continues to monitor the timer 234 to determine whether the timer 234 has reached the time limit. Block 620 of FIG. 6 corresponds to the time 414 ($T_6$) of FIG. 4. At block 620 and the time 414 ($T_6$), the example voltage curve 416 is at a voltage level of 20 volts; the example current curve 418 is at a current level of 3 amps; the example first adjustable current threshold value curve 420 changes from a current value of 17 amps to a current value of 8 amps; the example second adjustable current threshold value curve 422 is at a current value of 0 amps with a corresponding first duration threshold value of 0 ms; and the example third adjustable current threshold value curve 424 is at a current value of 6 amps with a corresponding second duration threshold value of 8 ms.

In the illustrated example, the contract analyzer 302, at block 622, monitors the first device for a second request for a new contract (e.g., a third contract). If the contract analyzer 302 detects a second request for a new contract (block 622: YES), the contract analyzer 302 negotiates the new contract between the first device and the second device at block 608. If the contract analyzer 302, does not detect a second request for a new contract (block 622: NO), the configuration manager 212 maintains the present configuration of the devices at block 624 (e.g., the hardware circuit breaker 206, the hardware current limiter 208, the firmware circuit breaker 216). At block 626, the contract analyzer 302 determines whether to continue operating. In some examples, the contract analyzer 302 stops operating because the power delivery controller 108 is no longer receiving power. In other examples, the contract analyzer 302 stops operating to save power. In other examples, the contract analyzer 302 stops operating because the first device is no longer connected to a second device. If the contract analyzer 302 determines, at block 626, to stop operating (block 626: NO) the program 600 ends at block 628. However, if the contract analyzer 302 determines to continue operating (block 626: YES), the contract analyzer 302 monitors the first device for a second request for a new contract at block 622.

Figure 7:
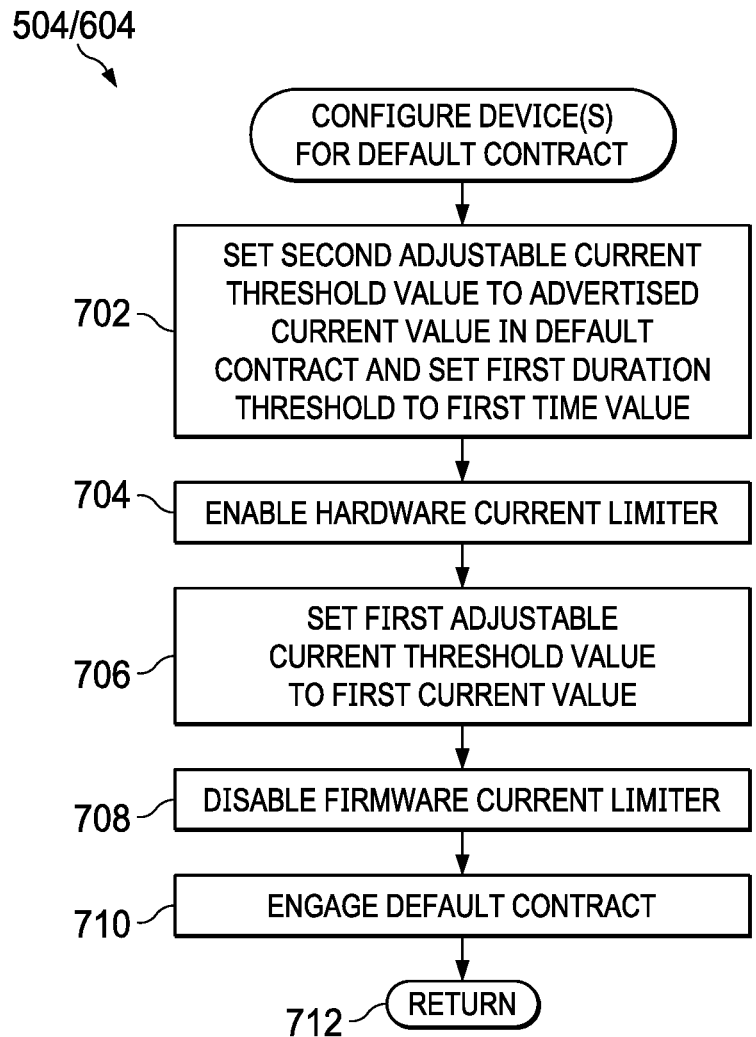
FIG. 7 is a flowchart representative of machine readable instructions that may be executed to implement the configuration manager of FIGS. 2 and 3 to configure current limits based on a contract between the first device and the second device.

FIG. 7 is a flowchart representative of machine readable instructions which may be executed to implement the configuration manager 212 of FIGS. 2 and 3 to configure one or more of the hardware circuit breaker 206, the hardware current limiter 208, or the firmware circuit breaker 216 for a default contract between the first device and the second device at block 604 of the program 600. The sub-program of block 604 begins at block 702 where the hardware current limit setter 308 sets the second adjustable current threshold value to an advertised current value based on the default contract between the first device and the second device by sending an analog voltage value to a register coupled to the current clamping circuit 222. At block 702 the hardware current limit setter 308 sets a first duration threshold to a first time value by sending an analog voltage value to a register coupled to the current clamping circuit 222. The hardware current limit setter 308 enables the hardware current limiter 208 at block 704. In the example the hardware current limit setter 308 enables the hardware current limiter 208 by sending a signal to the hardware current limiter 208 the signifies the hardware current limiter 208 is to run. The signal may be an interrupt, a logic high value, etc. In the example, the hardware circuit breaker setter 306 can enable the hardware circuit breaker 206 should the hardware circuit breaker 206 be disabled. At block 706, the hardware circuit breaker setter 306 sets the first adjustable current threshold value to a first current value that is based on the default contract and the SOA of the switch 204. The hardware circuit breaker setter 306 sets the first adjustable current threshold value by sending an analog voltage value to a register coupled to the analog comparator 220. At block 708, the firmware circuit breaker setter 310 disables the firmware circuit breaker 216. In the example, the firmware circuit breaker setter disables the firmware circuit breaker 216 by sending a signal to the firmware circuit breaker 216. The signal may be a logic low value, an interrupt, etc. At block 710, the contract analyzer 302 engages the default contract. The contract analyzer 302 engages the default contract by turning on the switch 204 with the proper configuration of one or more of the hardware circuit breaker 206, the hardware current limiter 208, or the firmware circuit breaker 216 according to the default contract. At block 712, the sub-program of block 604 returns to the program 600 at block 606.

Figure 8:
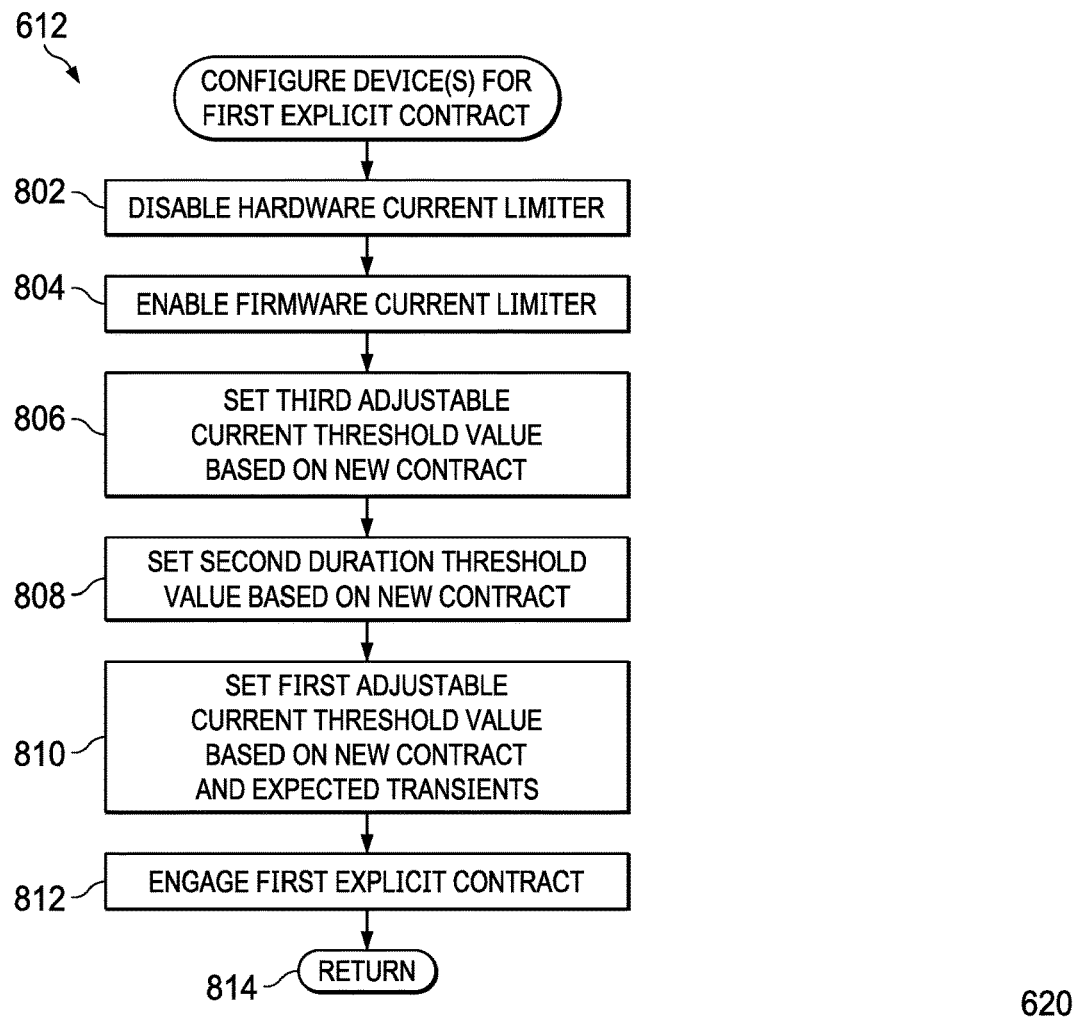
FIG. 8 is a flowchart representative of machine readable instructions that may be executed to implement the configuration manager of FIGS. 2 and 3 to configure current limits based on a first explicit contract between the first device and the second device.

FIG. 8 is a flowchart representative of machine readable instructions which may be executed to implement the configuration manager 212 of FIGS. 2 and 3 to configure one or more of the hardware circuit breaker 206, the hardware current limiter 208, or the firmware circuit breaker 216 for a first explicit contract between the first device and the second device at block 612 of the program 600. The sub-program of block 612 begins at block 802 where the hardware current limit setter 308 disables the hardware current limiter 208. In the example, the hardware current limit setter 308 disables the hardware current limiter 208 by sending a signal to the hardware current limiter 208. The signal may be a logic low value, an interrupt, etc. At block 804, the firmware circuit breaker setter 310 enables the firmware circuit breaker 216. In the example, the firmware circuit breaker setter 310 enables the firmware circuit breaker 216 by sending a signal to the firmware circuit breaker 216. For example, the firmware circuit breaker setter 310 can enable the firmware circuit breaker 216 should the firmware circuit breaker 216 be disabled. The signal may be a logic high value, an interrupt, etc. At block 806, the firmware circuit breaker setter 310 sets the third adjustable current threshold value to a second current value. The second current value is based on the new contract.

In the illustrated example of FIG. 8, the firmware circuit breaker setter 310, at block 808, sets the second duration threshold value to a second time value. The second time value is based on the amount of time that the switch 204 can withstand the second current value for the third adjustable current threshold value while still operating in the SOA of the switch 204. At block 810, the hardware circuit breaker setter 306 sets the first adjustable current threshold value to a third current value. The third current value is based on the new contract and/or the expected transients that occur when transitioning from the first voltage to the second voltage negotiated in the new contract. At block 812, the contract analyzer 302 engages the first explicit contract by turning on the switch 204 with the proper configuration of one or more of the hardware circuit breaker 206, the hardware current limiter 208, or the firmware circuit breaker 216 according to the first explicit contract. At block 814, the sub-program of block 612 returns to the program 600 at block 614.

Figure 9:
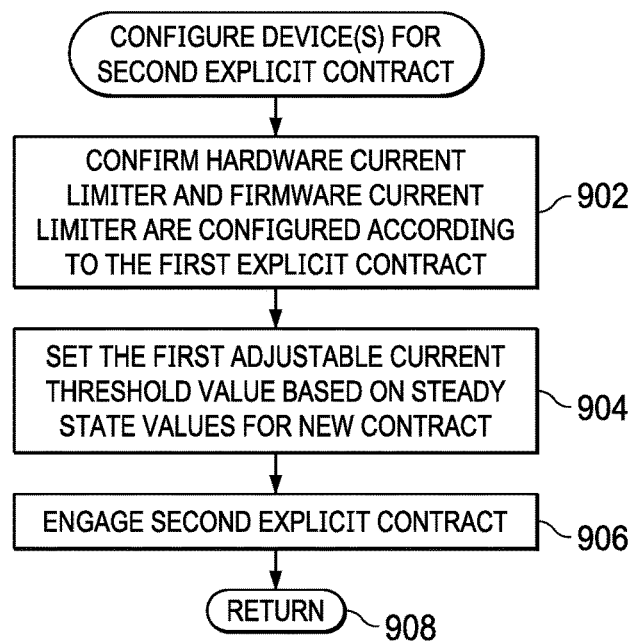
FIG. 9 is a flowchart representative of machine readable instructions that may be executed to implement the configuration manager of FIGS. 2 and 3 to configure current limits based on a second explicit contract between the first device and the second device.

FIG. 9 is a flowchart representative of machine readable instructions which may be executed to implement the configuration manager 212 of FIGS. 2 and 3 to configure one or more of the hardware circuit breaker 206, the hardware current limiter 208, or the firmware circuit breaker 216 for a second explicit contract between the first device and the second device at block 620 of the program 600. The sub-program of block 620 begins at block 902 where the configuration manager 212 confirms that one or more of the hardware circuit breaker 206, the hardware current limiter 208, or the firmware circuit breaker 216 are configured according to the first explicit contract. At block 904, the hardware circuit breaker setter 306 sets the first adjustable current threshold value to a fourth current value. The fourth current value is based on the first contract and/or the expected steady state current values for the second voltage negotiated in the new contract. At block 906, the contract analyzer 302 engages the second explicit contract by turning on the switch 204 with the proper configuration of one or more of the hardware circuit breaker 206 according to the second explicit contract, the hardware current limiter 208 according to the first explicit contract, or the firmware circuit breaker 216 according to the first explicit contract. At block 908, the sub-program of block 620 returns to the program 600 at block 622.

Configuring one or more of the hardware circuit breaker 206, the hardware current limiter 208, or the firmware circuit breaker 216 for the first explicit contract; and configuring one or more of the hardware circuit breaker 206, the hardware current limiter 208, or the firmware circuit breaker 216 for the second explicit contract are not limited to examples disclosed herein. Configuring one or more the hardware circuit breaker 206, the hardware current limiter 208, and the firmware circuit breaker 216 for the first explicit contract; and configuring one or more the hardware circuit breaker 206, the hardware current limiter 208, and the firmware circuit breaker 216 for the second explicit contract may include any combination of enabling and/or disabling the hardware circuit breaker 206, enabling and/or disabling the hardware current limiter 208, enabling and/or disabling the firmware circuit breaker 216, setting the first adjustable current threshold value, setting the second adjustable current threshold value, setting the first duration threshold value, setting the third adjustable current threshold value, and setting the second duration threshold value. The particular combination of enabling and/or disabling the hardware circuit breaker 206, enabling and/or disabling the hardware current limiter 208, enabling and/or disabling the firmware circuit breaker 216, setting the first adjustable current threshold value, setting the second adjustable current threshold value, setting the first duration threshold value, setting the third adjustable current threshold value and setting the second duration threshold value depends on the new contract that the configuration manager 212 negotiated between the first device (e.g., the internal power supply 110) and the second device (e.g., the external power supply 104) and whether the new contract causes the switch 204 to operate outside of the SOA for the switch 204 when utilizing the hardware current limiter 208 to control the current flowing from the first device to the second device.

For example, a first contract that causes the switch 204 to operate outside the SOA calls for 5 amps of current to be delivered at 20 volts. If the configuration manager 212 controls the example switch 204 with the hardware current limiter 208, the example switch 204 dissipates 100 watts of power. Additionally, for example, a second contract that does not cause the example switch 204 to operate outside the SOA calls for 1 amp of current to be delivered at 6 volts. If the configuration manager 212 controls the example switch 204 with the hardware current limiter 208, the example switch 204 dissipates 6 watts of power. Because the second example contract does not cause the example switch 204 to operate outside of the SOA of the switch 204, whereas the first example contract does, the second example contract will have a different combination of enabling and/or disabling the hardware circuit breaker 206, enabling and/or disabling the hardware current limiter 208, enabling and/or disabling the firmware circuit breaker 216, setting the first adjustable current threshold value, setting the second adjustable current threshold value, setting the first duration threshold value, setting the third adjustable current threshold value, and setting the second duration threshold value than the first example contract.

Figure 10:
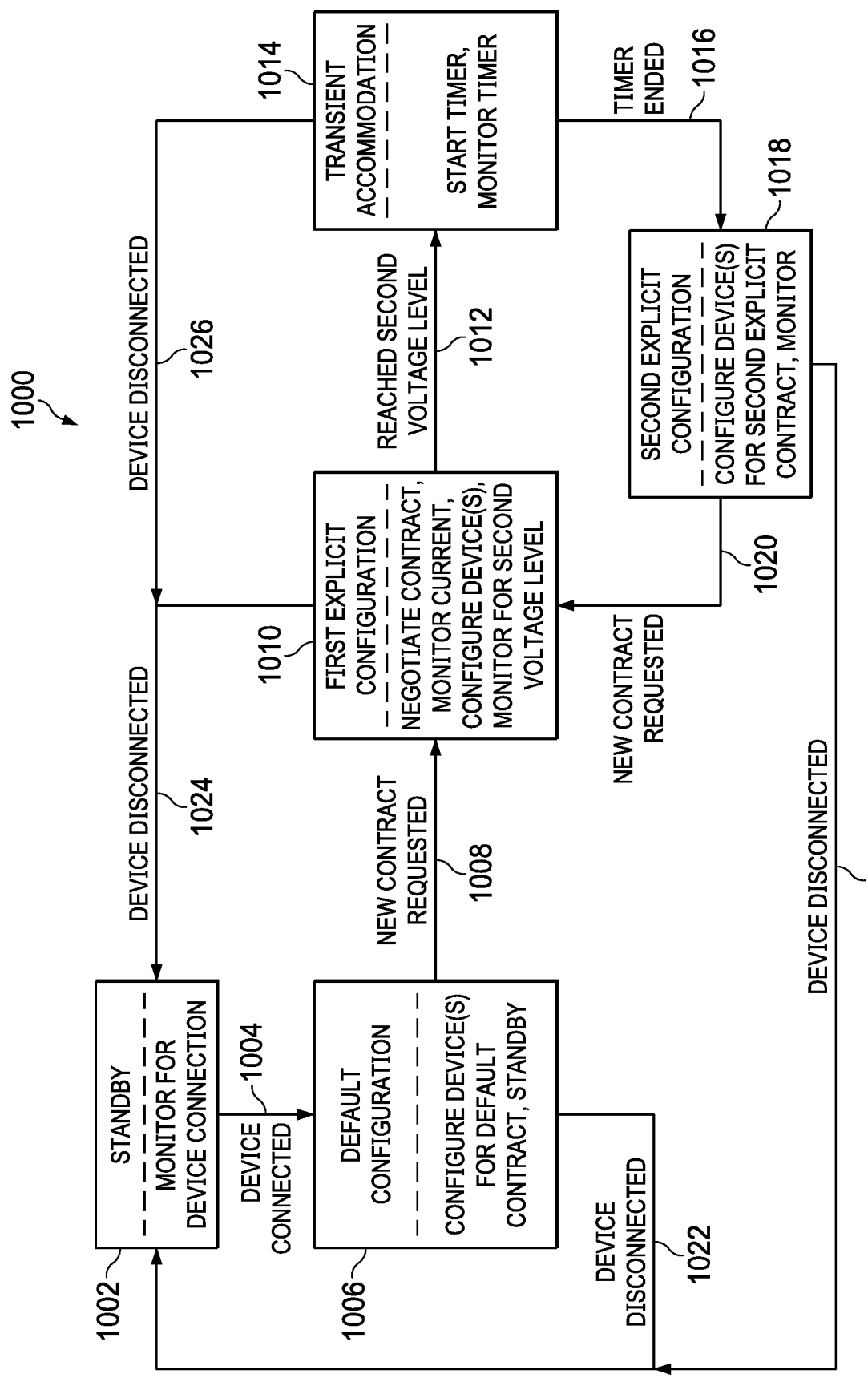
FIG. 10 is a state diagram representative of example operating states in which the configuration manager of FIGS. 2 and/or 3 may operate.

FIG. 10 is a state diagram 1000 representative of example operating states in which the configuration manager 212 of FIGS. 2 and/or 3 may operate. When in an example first state 1002, the configuration manager 212 is in an example standby mode (e.g., not connected). The example first state 1002 includes a first operating condition 1004. The first operating condition 1004 determines whether the example configuration manager 212 leaves the example first state 1002. In the example first state 1002, the configuration manager 212 monitors the CC node 228 and the VBUS node 226 to determine whether the first device (e.g., the internal power supply 110) has connected to a second device (e.g., the external power supply 104). Once a second device is connected to the first device, the first operating condition 1004 is satisfied.

In the illustrated example of FIG. 10, in response to a second device being connected to the first device, the configuration manager 212 enters an example second state 1006 with an example second operating condition 1008. In the example second state 1006, the configuration manager 212 configures one or more devices for a default contract between the first device and the second device. More specifically, in the example second state 1006, the hardware circuit breaker setter 306 configures the hardware circuit breaker 206, the hardware current limit setter 308 configures the hardware current limiter 208, and the firmware circuit breaker setter 310 configures the firmware circuit breaker 216. After the configuration manager 212 configures the one or more devices, the configuration manager 212 monitors the first device for a first request to transition from a first voltage level to a second voltage level. When a first request to transition from a first voltage level to a second voltage level is detected, the example second operating condition 1008 is satisfied.

In the illustrated example of FIG. 10, in response to a first request to transition from a first voltage level to a second voltage level, the configuration manager 212 enters an example third state 1010 with an example third operating condition 1012. In the example third state 1010, the configuration manager 212 negotiates a new contract between the first device and the second device. Additionally, in the example third state 1010, the configuration manager 212 monitors the current flowing between the first device and the second device utilizing the second hardware current sensor 224. Also, in the example third state 1010, the configuration manager 212 configures the devices for a first explicit contract between the first device and the second device and monitors the second device, at the CC node 228, for the second voltage level negotiated in the new contract. When the configuration manager 212 detects the second voltage level negotiated in the new contract, the example third operating condition 1012 is satisfied.

In the illustrated example of FIG. 10, in response to the second voltage level negotiated in the new contract being detected, the configuration manager 212 enters an example fourth state 1014 with an example fourth operating condition 1016. In the example fourth state 1014, the configuration manager 212 starts a timer (e.g., the timer 234) and monitors the timer (e.g., the timer 234). When the example configuration manager 212 determines that the timer (e.g., the timer 234) has reached a time limit associated with the timer (e.g., the timer 234), the fourth operating condition 1016 has been satisfied.

In the illustrated example of FIG. 10, in response to the timer reaching the time limit, the configuration manager 212 enters an example fifth state 1018 with an example fifth operating condition 1020. In the example fifth state 1018, the configuration manager 212 configures the devices for a second explicit contract between the first device and the second device and the configuration manager 212 monitors the first device for a second request for a new contract. When the configuration manager 212 detects a second request for a new contract, the fifth operating condition 1020 has been satisfied and the configuration manager 212 enters the example third state 1010.

In the illustrated example of FIG. 10, each of the example second state 1006, the example third state 1010, the example fourth state 1014, and the example fifth state 1018 includes an example sixth operating condition 1022, an example seventh operating condition 1024, an example eighth operating condition 1026, and an example ninth operating condition 1028, respectively. In the example, each of the sixth operating condition 1022, the seventh operating condition 1024, the eighth operating condition 1026, and the ninth operating condition 1028 determines whether the example configuration manager 212 returns to the first state 1002 from the second state 1006, the third state 1010, the fourth state 1014, or the fifth state 1018, respectively. When the configuration manager 212 determines that the first device (e.g., the internal power supply 110) has disconnected from a second device (e.g., the external power supply 104), each of the sixth operating condition 1022, the seventh operating condition 1024, the eighth operating condition 1026, and the ninth operating condition 1028 is satisfied and the configuration manager 212 returns to the first state 1002 from the second state 1006, the third state 1010, the fourth state 1014, or the fifth state 1018, respectively.

Example methods, apparatus, systems, and articles of manufacture dynamically limit current are disclosed herein. Further examples and combinations thereof include the following: Example 1 includes a power delivery controller comprising a power control device, a first current control device coupled to the power control device, the first current control device configured to control the power control device when a current level associated with a current flowing between a first device and a second device exceeds a first adjustable current threshold value, a second current control device coupled to the power control device, the second current control device configured to control the power control device when the current level exceeds a second adjustable current threshold value, and a configuration manager, coupled to the first current control device and the second current control device, the configuration manager configured to, during runtime, set a first configuration setting of the first current control device and a second configuration setting of the second current control device, wherein the first configuration setting corresponds to the first adjustable current threshold value and the second configuration setting corresponds to the second adjustable current threshold value, the first configuration setting and second configuration setting based on a negotiated contract corresponding to the first device and the second device.

Example 2 includes the power delivery controller of example 1, wherein the first configuration setting and the second configuration setting are additionally based on safe operation of the power control device.

Example 3 includes the power delivery controller of example 1, wherein the first current control device includes a hardware circuit breaker and the second current control device includes a firmware circuit breaker.

Example 4 includes the power delivery controller of example 3, wherein the configuration manager is to set a third configuration setting of the second current control device and a fourth configuration setting of the second current control device, wherein the third configuration setting corresponds to a first duration threshold value and the fourth configuration setting corresponds to an enable value.

Example 5 includes the power delivery controller of example 4, wherein the hardware circuit breaker is to open the power control device when the current level exceeds the first adjustable current threshold value and the firmware circuit breaker is to monitor the current level for the second adjustable current threshold value and in response to the current level exceeding the second adjustable current threshold value for the first duration threshold value, open the power control device.

Example 6 includes the power delivery controller of example 4, wherein the configuration manager is to in response to a first request from the first device to transition from a first voltage level to a second voltage level, negotiate a new contract different from the negotiated contract, monitor the current level, configure one or more of the hardware circuit breaker or the firmware circuit breaker for a first explicit contract, based on the negotiated contract, the first configuration setting, the second configuration setting, the third configuration setting, and the fourth configuration setting, monitor the second device for the second voltage level, in response to the second device reaching the second voltage level, start a timer including a time limit, in response to the timer reaching the time limit, configure one or more of the hardware circuit breaker or the firmware circuit breaker for a second explicit contract based on the first explicit contract, the first configuration setting, the second configuration setting, the third configuration setting, and the fourth configuration setting, and monitor the first device for a second request to transition to a third voltage level.

Example 7 includes the power delivery controller of example 6, wherein the configuration manager is further configured to enable the firmware circuit breaker, based on the fourth configuration setting, set the second adjustable current threshold value to a first current value, based on the second configuration setting, set the first duration threshold value to a first time value based on the third configuration setting, set the first adjustable current threshold value to a second current value, based on the first configuration setting, engage the first explicit contract, and set the first adjustable current threshold value to a third current value based on the first configuration setting.

Example 8 includes the power delivery controller of example 3, wherein the configuration manager is further configured to, in response to detecting the first device has connected to the second device, set a fifth configuration setting of the hardware circuit breaker and a sixth configuration setting of the firmware circuit breaker, based on a default contract between the first device and the second device.

Example 9 includes the power delivery controller of example 1, wherein the first current control device includes a hardware circuit breaker and the second current control device includes a hardware current limiter.

Example 10 includes the power delivery controller of example 9, wherein the configuration manager is to set a seventh configuration setting of the second current control device and an eighth configuration setting of the second current control device, wherein the seventh configuration setting corresponds to a first duration threshold value and the eighth configuration setting corresponds to an enable value.

Example 11 includes the power delivery controller of example 10, wherein the hardware circuit breaker is to open the power control device when the current level exceeds the first adjustable current threshold value and the hardware current limiter is to limit the current level to the second adjustable current threshold value and in response to limiting the current level to the second adjustable current threshold value for the first duration threshold value, open the power control device.

Example 12 includes the power delivery controller of example 10, wherein the configuration manager is to in response to a first request from the first device to transition from a first voltage level to a second voltage level, negotiate a new contract different than the negotiated contract, monitor the current level, configure one or more of the hardware circuit breaker or the hardware current limiter for a first explicit contract, based on the negotiated contract and the first configuration setting, the second configuration setting, the seventh configuration setting, and the eighth configuration setting, monitor the second device for the second voltage level, in response to the second device reaching the second voltage level, start a timer including a time limit, in response to the timer reaching the time limit, configure one or more of the hardware circuit breaker or the hardware current limiter for a second explicit contract based on the first explicit contract, the first configuration setting, the second configuration setting, the seventh configuration setting, and the eighth configuration setting, and monitor the first device for a second request to transition to a third voltage level.

Example 13 includes the power delivery controller of example 12, wherein the configuration manager is further configured to disable the hardware current limiter, based on the eighth configuration setting, set the first duration threshold value to a first time value based on the seventh configuration setting, set the first adjustable current threshold value to a first current value, based on the first configuration setting, engage the first explicit contract, and set the first adjustable current threshold value to a second current value based on the first configuration setting.

Example 14 includes the power delivery controller of example 9, wherein the configuration manager is further configured to, in response to detecting the first device has connected to the second device, set a ninth configuration setting of the hardware circuit breaker and a tenth configuration setting of the hardware current limiter, based on a default contract between the first device and the second device.

Example 15 includes the power delivery controller of example 1, wherein the first current control device includes a hardware current limiter and the second current control device includes a firmware circuit breaker.

Example 16 includes the power delivery controller of example 15, wherein the configuration manager is to set an eleventh configuration setting of the first current control device, a twelfth configuration setting of the first current control device, a thirteenth configuration setting of the second current control device, and a fourteenth configuration setting of the second current control device, wherein the eleventh configuration setting corresponds to a first duration threshold value, the twelfth configuration setting corresponds to a first enable value, the thirteenth configuration setting corresponds to a second duration threshold value, and the fourteenth configuration setting corresponds to a second enable value.

Example 17 includes the power delivery controller of example 16, wherein the hardware current limiter is to limit the current level to the first adjustable current threshold value and in response to limiting the current level to the first adjustable current threshold value for the first duration threshold value, open the power control device, and the firmware circuit breaker is to monitor the current level for the second adjustable current threshold value and in response to the current level exceeding the second adjustable current threshold value for the second duration threshold value, open the power control device.

Example 18 includes the power delivery controller of example 16, wherein the configuration manager is to in response to a first request from the first device to transition from a first voltage level to a second voltage level, negotiate a new contract different than the negotiated contract, monitor the current level, configure one or more of the hardware current limiter or the firmware circuit breaker for a first explicit contract, based on the negotiated contract, the first configuration setting, the second configuration setting, the eleventh configuration setting, the twelfth configuration setting, the thirteenth configuration setting, and the fourteenth configuration setting, monitor the second device for the second voltage level, in response to the second device reaching the second voltage level, start a timer including a time limit, in response to the timer reaching the time limit, configure one or more of the hardware current limiter or the firmware circuit breaker for a second explicit contract based on the first explicit contract, the first configuration setting, the second configuration setting, the eleventh configuration setting, the twelfth configuration setting, the thirteenth configuration setting, and the fourteenth configuration setting, and monitor the first device for a second request to transition to a third voltage level.

Example 19 includes the power delivery controller of example 18, wherein the configuration manager is further configured to disable the hardware current limiter, based on the twelfth configuration setting, enable the firmware circuit breaker, based on the fourteenth configuration setting, set the first duration threshold value to a first time value based on the eleventh configuration setting, set the second adjustable current threshold value to a first current value, based on the second configuration setting, set the second duration threshold value to a second time value based on the thirteenth configuration setting, and engage the first explicit contract.

Example 20 includes the power delivery controller of example 15, wherein the configuration manager is further configured to, in response to detecting the first device has connected to the second device, set a fifteenth configuration setting of the hardware current limiter and a sixteenth configuration setting of the firmware circuit breaker, based on a default contract between the first device and the second device.

Example 21 includes a system comprising a first device configured to receive power from a second device, a power delivery controller including a power control device, a first current control device coupled to the power control device, the first current control device configured to control the power control device when a current level associated with a current flowing between the first device and the second device exceeds a first adjustable current threshold value, a second current control device coupled to the power control device, the second current control device to control the power control device when the current level exceeds a second adjustable current threshold value, and the power delivery controller to, during runtime, set a first configuration setting of the first current control device and a second configuration setting of the second current control device, wherein the first configuration setting corresponds to the first adjustable current threshold value and the second configuration setting corresponds to the second adjustable current threshold value, the first configuration setting and the second configuration setting based on a negotiated contract corresponding to the first device and the second device.

Example 22 includes the system of example 21, wherein the first configuration setting and the second configuration setting are additionally based on safe operation of the power control device.

Example 23 includes the system of example 21, wherein the first device is coupled to the power control device and the power delivery controller is configured to be coupled to the second device via the power control device.

Example 24 includes the system of example 21, wherein the first device includes the power delivery controller.

Example 25 includes the system of example 21, wherein the first current control device includes a hardware circuit breaker and the second current control device includes a firmware circuit breaker.

Example 26 includes the system of example 25, wherein the power delivery controller is to set a third configuration setting of the second current control device and a fourth configuration setting of the second current control device, wherein the third configuration setting corresponds to a first duration threshold value and the fourth configuration setting corresponds to an enable value.

Example 27 includes the system of example 26, wherein the hardware circuit breaker is to open the power control device when the current level exceeds the first adjustable current threshold value and the firmware circuit breaker is to monitor the current level for the second adjustable current threshold value and in response to the current level exceeding the second adjustable current threshold value for the first duration threshold value, open the power control device.

Example 28 includes the system of example 26, wherein the power delivery controller is to in response to a first request from the first device to transition from a first voltage level to a second voltage level, negotiate a new contract different than the negotiated contract, monitor the current level, configure one or more of the hardware circuit breaker or the firmware circuit breaker for a first explicit contract, based on the negotiated contract, the first configuration setting, the second configuration setting, the third configuration setting, and the fourth configuration setting, monitor the second device for the second voltage level, in response to the second device reaching the second voltage level, start a timer including a time limit, in response to the timer reaching the time limit, configure one or more of the hardware circuit breaker or the firmware circuit breaker for a second explicit contract based on the first explicit contract, the first configuration setting, the second configuration setting, the third configuration setting, and the fourth configuration setting, and monitor the first device for a second request to transition to a third voltage level.

Example 29 includes the system of example 28, wherein the power delivery controller is further configured to enable the firmware circuit breaker, based on the fourth configuration setting, set the second adjustable current threshold value to a first current value, based on the second configuration setting, set the first duration threshold value to a first time value based on the third configuration setting, set the first adjustable current threshold value to a second current value, based on the first configuration setting, engage the first explicit contract, and set the first adjustable current threshold value to a third current value based on the first configuration setting.

Example 30 includes the system of example 25, wherein the power delivery controller is further configured to, in response to detecting the first device has connected to the second device, set a fifth configuration setting of the hardware circuit breaker and a sixth configuration setting of the firmware circuit breaker, based on a default contract between the first device and the second device.

Example 31 includes the system of example 21, wherein the first current control device includes a hardware circuit breaker and the second current control device includes a hardware current limiter.

Example 32 includes the system of example 31, wherein the power delivery controller is to set a seventh configuration setting and an eighth configuration setting, wherein the seventh configuration setting corresponds to a first duration threshold value and the eighth configuration setting corresponds to an enable value.

Example 33 includes the system of example 32, wherein the hardware circuit breaker is to open the power control device when the current level exceeds the first adjustable current threshold value and the hardware current limiter is to limit the current level to the second adjustable current threshold value and in response to limiting the current level to the second adjustable current threshold value for the first duration threshold value, open the power control device.

Example 34 includes the system of example 32, wherein the power delivery controller is to in response to a first request from the first device to transition from a first voltage level to a second voltage level, negotiate a new contract different than the negotiated contract, monitor the current level, configure one or more of the hardware circuit breaker or the hardware current limiter for a first explicit contract, based on the negotiated contract and the first configuration setting, the second configuration setting, the seventh configuration setting, and the eighth configuration setting, monitor the second device for the second voltage level, in response to the second device reaching the second voltage level, start a timer including a time limit, in response to the timer reaching the time limit, configure one or more of the hardware circuit breaker or the hardware current limiter for a second explicit contract based on the first explicit contract, the first configuration setting, the second configuration setting, the seventh configuration setting, and the eighth configuration setting, and monitor the first device for a second request to transition to a third voltage level.

Example 35 includes the system of example 34, wherein the power delivery controller is further configured to disable the hardware current limiter, based on the eighth configuration setting, set the first duration threshold value to a first time value based on the seventh configuration setting, set the first adjustable current threshold value to a first current value, based on the first configuration setting, engage the first explicit contract, and set the first adjustable current threshold value to a second current value based on the first configuration setting.

Example 36 includes the system of example 31, wherein the power delivery controller is further configured to, in response to detecting the first device has connected to the second device, set a ninth configuration setting of the hardware circuit breaker and a tenth configuration setting of the hardware current limiter, based on a default contract between the first device and the second device.

Example 37 includes the system of example 21, wherein the first current control device includes a hardware current limiter and the second current control device includes a firmware circuit breaker.

Example 38 includes the system of example 37, wherein the power delivery controller is to set an eleventh configuration setting of the first current control device, a twelfth configuration setting of the first current control device, a thirteenth configuration setting of the second current control device, and a fourteenth configuration setting of the second current control device, wherein the eleventh configuration setting corresponds to a first duration threshold value, the twelfth configuration setting corresponds to a first enable value, the thirteenth configuration setting corresponds to a second duration threshold value, and the fourteenth configuration setting corresponds to a second enable value.

Example 39 includes the system of example 38, wherein the hardware current limiter is to limit the current level to the first adjustable current threshold value and in response to limiting the current level to the first adjustable current threshold value for the first duration threshold value, open the power control device, and the firmware circuit breaker is to monitor the current level for the second adjustable current threshold value and in response to the current level exceeding the second adjustable current threshold value for the second duration threshold value, open the power control device.

Example 40 includes the system of example 38, wherein the power delivery controller is to in response to a first request from the first device to transition from a first voltage level to a second voltage level, negotiate a new contract different from the negotiated contract, monitor the current level, configure one or more of the hardware current limiter or the firmware circuit breaker for a first explicit contract, based on the negotiated contract, the first configuration setting, the second configuration setting, the eleventh configuration setting, the twelfth configuration setting, the thirteenth configuration setting, and the fourteenth configuration setting, monitor the second device for the second voltage level, in response to the second device reaching the second voltage level, start a timer including a time limit, in response to the timer reaching the time limit, configure one or more of the hardware current limiter or the firmware circuit breaker for a second explicit contract based on the first explicit contract, the first configuration setting, the second configuration setting, the eleventh configuration setting, the twelfth configuration setting, the thirteenth configuration setting, and the fourteenth configuration setting, and monitor the first device for a second request to transition to a third voltage level.

Example 41 includes the system of example 40, wherein the power delivery controller is further configured to disable the hardware current limiter, based on the twelfth configuration setting, enable the firmware circuit breaker, based on the fourteenth configuration setting, set the first duration threshold value to a first time value based on the eleventh configuration setting, set the second adjustable current threshold value to a first current value, based on the second configuration setting, set the second duration threshold value to a second time value based on the thirteenth configuration setting, and engage the first explicit contract.

Example 42 includes the system of example 37, wherein the power delivery controller is further configured to, in response to detecting the first device has connected to the second device, set a fifteenth configuration setting of the hardware current limiter and a sixteenth configuration setting of the firmware circuit breaker, based on a default contract between the first device and the second device.

Example 43 includes a method comprising controlling a power control device with a first current control device when a current level associated with a current flowing between a first device and a second device exceeds a first adjustable current threshold value, controlling the power control device with a second current control device when the current level exceeds a second adjustable current threshold value, and during runtime of a controller including the first current control device and the second current control device, setting a first configuration setting of the first current control device and a second configuration setting of the second current control device, wherein the first configuration setting corresponds to the first adjustable current threshold value and the second configuration setting corresponds to the second adjustable current threshold value, the first configuration setting and the second configuration setting based on a negotiated contract corresponding to the first device and the second device.

Example 44 includes the method of example 43, wherein the first configuration setting and the second configuration setting are additionally based on safe operation of the power control device.

Example 45 includes the method of example 43, wherein the first current control device includes a hardware circuit breaker and the second current control device includes a firmware circuit breaker.

Example 46 includes the method of example 45, further including setting a third configuration setting of the second current control device and a fourth configuration setting of the second current control device, wherein the third configuration setting corresponds to a first duration threshold value and the fourth configuration setting corresponds to an enable value.

Example 47 includes the method of example 46, further including opening the power control device when the current level exceeds the first adjustable current threshold value, and monitoring the current level for the second adjustable current threshold value and in response to the current level exceeding the second adjustable current threshold value for the first duration threshold value, opening the power control device.

Example 48 includes the method of example 46, further including in response to a first request from the first device to transition from a first voltage level to a second voltage level, negotiating a new contract different than the negotiated contract, monitoring the current level, configuring one or more of the hardware circuit breaker or the firmware circuit breaker for a first explicit contract, based on the negotiated contract, the first configuration setting, the second configuration setting, the third configuration setting, and the fourth configuration setting, monitoring the second device for the second voltage level, in response to the second device reaching the second voltage level, starting a timer including a time limit, in response to the timer reaching the time limit, configuring one or more of the hardware circuit breaker or the firmware circuit breaker for a second explicit contract based on the first explicit contract, the first configuration setting, the second configuration setting, the third configuration setting, and the fourth configuration setting, and monitoring the first device for a second request to transition to a third voltage level.

Example 49 includes the method of example 48, further including enabling the firmware circuit breaker, based on the fourth configuration setting, setting the second adjustable current threshold value to a first current value, based on the second configuration setting, setting the first duration threshold value to a first time value based on the third configuration setting, setting the first adjustable current threshold value to a second current value, based on the first configuration setting, engaging the first explicit contract, and setting the first adjustable current threshold value to a third current value based on the first configuration setting.

Example 50 includes the method of example 45, further including, in response to detecting the first device has connected to the second device, setting a fifth configuration setting of the hardware circuit breaker and a sixth configuration setting of the firmware circuit breaker, based on a default contract between the first device and the second device.

Example 51 includes the method of example 43, wherein the first current control device includes a hardware circuit breaker and the second current control device includes a hardware current limiter.

Example 52 includes the method of example 51, further including setting a seventh configuration setting of the second current control device and an eighth configuration setting of the second current control device, wherein the seventh configuration setting corresponds to a first duration threshold value and the eighth configuration setting corresponds to an enable value.

Example 53 includes the method of example 52, further including opening the power control device when the current level exceeds the first adjustable current threshold value, limiting the current level to the second adjustable current threshold value, and in response to limiting the current level to the second adjustable current threshold value for the first duration threshold value, opening the power control device.

Example 54 includes the method of example 52, further including in response to a first request from the first device to transition from a first voltage level to a second voltage level, negotiating a new contract different from the negotiated contract, monitoring the current level, configuring one or more of the hardware circuit breaker or the hardware current limiter for a first explicit contract, based on the negotiated contract, the first configuration setting, the second configuration setting, the seventh configuration setting, and the eighth configuration setting, monitoring the second device for the second voltage level, in response to the second device reaching the second voltage level, starting a timer including a time limit, in response to the timer reaching the time limit, configuring one or more of the hardware circuit breaker or the hardware current limiter for a second explicit contract based on the first explicit contract, the first configuration setting, the second configuration setting, the seventh configuration setting, and the eighth configuration setting, and monitoring the first device for a second request to transition to a third voltage level.

Example 55 includes the method of example 54, further including disabling the hardware current limiter, based on the eighth configuration setting, setting the first duration threshold value to a first time value based on the seventh configuration setting, setting the first adjustable current threshold value to a first current value, based on the first configuration setting, engaging the first explicit contract, and setting the first adjustable current threshold value to a second current value based on the first configuration setting.

Example 56 includes the method of example 51, further including, in response to detecting the first device has connected to the second device, setting a ninth configuration setting of the hardware circuit breaker and s tenth configuration setting of the hardware current limiter, based on a default contract between the first device and the second device.

Example 57 includes the method of example 43, wherein the first current control device includes a hardware current limiter and the second current control device includes a firmware circuit breaker.

Example 58 includes the method of example 57, further including setting an eleventh configuration setting of the first current control device, a twelfth configuration setting of the first current control device, a thirteenth configuration setting of the second current control device, and a fourteenth configuration setting of the second current control device, wherein the eleventh configuration setting corresponds to a first duration threshold value, the twelfth configuration setting corresponds to a first enable value, the thirteenth configuration setting corresponds to a second duration threshold value, and the fourteenth configuration setting corresponds to a second enable value.

Example 59 includes the method of example 58, further including limiting the current level to the first adjustable current threshold value, in response to limiting the current level to the first adjustable current threshold value for the first duration threshold value, opening the power control device, monitoring the current level for the second adjustable current threshold value, and in response to the current level exceeding the second adjustable current threshold value for the second duration threshold value, opening the power control device.

Example 60 includes the method of example 58, further including in response to a first request from the first device to transition from a first voltage level to a second voltage level, negotiating a new contract different from the negotiated contract, monitoring the current level, configuring one or more of the hardware current limiter or the firmware circuit breaker for a first explicit contract, based on the negotiated contract, the first configuration setting, the second configuration setting, the eleventh configuration setting, the twelfth configuration setting, the thirteenth configuration setting, and the fourteenth configuration setting, monitoring the second device for the second voltage level, in response to the second device reaching the second voltage level, starting a timer including a time limit, in response to the timer reaching the time limit, configuring one or more of the hardware current limiter or the firmware circuit breaker for a second explicit contract based on the first explicit contract, the first configuration setting, the second configuration setting, the eleventh configuration setting, the twelfth configuration setting, the thirteenth configuration setting, and the fourteenth configuration setting, and monitoring the first device for a second request to transition to a third voltage level.

Example 61 includes the method of example 60, further including disabling the hardware current limiter, based on the twelfth configuration setting, enabling the firmware circuit breaker, based on the fourteenth configuration setting, setting the first duration threshold value to a first time value based on the eleventh configuration setting, setting the second adjustable current threshold value to a first current value, based on the second configuration setting, setting the second duration threshold value to a second time value based on the thirteenth configuration setting, and engaging the first explicit contract.

Example 62 includes the method of example 57, further including, in response to detecting the first device has connected to the second device, setting a fifteenth configuration setting of the hardware current limiter and a sixteenth configuration setting of the firmware circuit breaker, based on a default contract between the first device and the second device.

From the foregoing, it will be appreciated that example methods, apparatus and articles of manufacture have been disclosed that improve the functionality of a power delivery controller. Examples disclosed herein allow a power deliver controller to utilize a hardware circuit breaker, a hardware current limiter, or a firmware circuit breaker to limit the current flowing from a first device to a second device. The disclosed methods, apparatus and articles of manufacture improve the efficiency of using a computing device by increasing the available functionality of a power delivery controller and reducing the power loss of a computing device when limiting current in a power delivery application. Examples disclosed herein include dynamically changing between current limiting methods based on the current limiting method that best suits the contract between two devices. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A power delivery controller incorporated in a first device and operable to control power delivery between the first device and a second device, the power delivery controller comprising:

a power control device adapted to be coupled to the second device via a serial bus;

a first current control device coupled to the power control device, the first current control device configured to control the power control device when a current level associated with a current flowing between the first device and the second device exceeds a first adjustable current threshold value;

a second current control device coupled to the power control device, the second current control device configured to control the power control device when the current level exceeds a second adjustable current threshold value;

a configuration manager, coupled to the first current control device and the second current control device, the configuration manager configured to, during runtime, set a first configuration setting of the first current control device and a second configuration setting of the second current control device, wherein the first configuration setting corresponds to the first adjustable current threshold value and the second configuration setting corresponds to the second adjustable current threshold value, the first configuration setting and second configuration setting based on a negotiated contract corresponding to the first device and the second device;

wherein, the configuration manager is to set a third configuration setting of the second current control device and a fourth configuration setting of the second current control device, wherein the third configuration setting corresponds to a first duration threshold value and the fourth configuration setting corresponds to an enable value;

wherein, the first current control device is operable to open the power control device when the current level exceeds the first adjustable current threshold value and the second current control device is to monitor the current level for the second adjustable current threshold value and in response to the current level exceeding the second adjustable current threshold value for the first duration threshold value, open the power control device; and wherein, the configuration manager is operable to:
in response to a first request from the first device, transition from a first voltage level to a second voltage level and negotiate a new contract different from the negotiated contract;
monitor the current level;

configure one or more of the first current control device or the second current control device for a first explicit contract, based on the negotiated contract, the first configuration setting, the second configuration setting, the third configuration setting, and the fourth configuration setting;

monitor the second device for the second voltage level;

in response to the second device reaching the second voltage level, start a timer including a time limit;

in response to the timer reaching the time limit, configure one or more of the first current control device or the second current control device for a second explicit contract based on the first explicit contract, the first configuration setting, the second configuration setting, the third configuration setting, and the fourth configuration setting; and monitor the first device for a second request to transition to a third voltage level.

2. The power delivery controller of claim 1, wherein the first configuration setting and the second configuration setting are additionally based on safe operation of the power control device.

3. The power delivery controller of claim 1, wherein the first current control device includes a hardware circuit breaker and the second current control device includes a firmware circuit breaker.

4. The power delivery controller of claim 1, wherein the configuration manager is further configured to:

enable the firmware circuit breaker, based on the fourth configuration setting;

set the second adjustable current threshold value to a first current value, based on the second configuration setting;

set the first duration threshold value to a first time value based on the third configuration setting;

set the first adjustable current threshold value to a second current value, based on the first configuration setting;

engage the first explicit contract; and set the first adjustable current threshold value to a third current value based on the first configuration setting.

5. The power delivery controller of claim 3, wherein the configuration manager is further configured to, in response to detecting the first device has connected to the second device, set a fifth configuration setting of the hardware circuit breaker and a sixth configuration setting of the firmware circuit breaker, based on a default contract between the first device and the second device.

6. The power delivery controller of claim 1, wherein the first current control device includes a hardware circuit breaker and the second current control device includes a hardware current limiter.

7. The power delivery controller of claim 6, wherein the configuration manager is to set a seventh configuration setting of the second current control device and an eighth configuration setting of the second current control device, wherein the seventh configuration setting corresponds to a first duration threshold value and the eighth configuration setting corresponds to an enable value.

8. The power delivery controller of claim 7, wherein the hardware circuit breaker is to open the power control device when the current level exceeds the first adjustable current threshold value and the hardware current limiter is to limit the current level to the second adjustable current threshold value and in response to limiting the current level to the second adjustable current threshold value for the first duration threshold value, open the power control device.

9. The power delivery controller of claim 6, wherein the configuration manager is further configured to, in response to detecting the first device has connected to the second device, set a ninth configuration setting of the hardware circuit breaker and a tenth configuration setting of the hardware current limiter, based on a default contract between the first device and the second device.

10. A power delivery controller incorporated in a first device and operable to control power delivery between the first device and a second device, the power delivery controller comprising:

a power control device adapted to be coupled to the second device via a serial bus;

a first current control device coupled to the power control device, the first current control device configured to control the power control device when a current level associated with a current flowing between the first device and the second device exceeds a first adjustable current threshold value;

a second current control device coupled to the power control device, the second current control device configured to control the power control device when the current level exceeds a second adjustable current threshold value;

a configuration manager, coupled to the first current control device and the second current control device, the configuration manager configured to, during runtime, set a first configuration setting of the first current control device and a second configuration setting of the second current control device, wherein the first configuration setting corresponds to the first adjustable current threshold value and the second configuration setting corresponds to the second adjustable current threshold value, the first configuration setting and second configuration setting based on a negotiated contract corresponding to the first device and the second device;

wherein, the configuration manager is operable to set a third configuration setting of the second current control device and a fourth configuration setting of the second current control device, wherein the third configuration setting corresponds to a first duration threshold value and the fourth configuration setting corresponds to an enable value; and wherein the configuration manager is operable to:

in response to a first request from the first device, transition from a first voltage level to a second voltage level and negotiate a new contract different than the negotiated contract;

monitor the current level;

configure one or more of the first current control device or the second current control device for a first explicit contract, based on the negotiated contract and the first configuration setting, the second configuration setting, the third configuration setting, and the fourth configuration setting;

monitor the second device for the second voltage level;

in response to the second device reaching the second voltage level, start a timer including a time limit;

in response to the timer reaching the time limit, configure one or more of the first current control device or the second control device for a second explicit contract based on the first explicit contract, the first configuration setting, the second configuration setting, the third configuration setting, and the fourth configuration setting; and monitor the first device for a second request to transition to a third voltage level.

11. The power delivery controller of claim 10, wherein the configuration manager is further configured to:
disable the second current control device, based on the fourth configuration setting;
set the first duration threshold value to a first time value based on the third configuration setting;
set the first adjustable current threshold value to a first current value, based on the first configuration setting;
engage the first explicit contract; and
set the first adjustable current threshold value to a second current value based on the first configuration setting.

12. A power delivery controller incorporated in a first device and operable to control power delivery between the first device and a second device, the power delivery controller comprising:
a power control device adapted to be coupled to the second device via a serial bus;
a first current control device coupled to the power control device, the first current control device configured to control the power control device when a current level associated with a current flowing between the first device and the second device exceeds a first adjustable current threshold value;
a second current control device coupled to the power control device, the second current control device configured to control the power control device when the current level exceeds a second adjustable current threshold value; and
a configuration manager, coupled to the first current control device and the second current control device, the configuration manager configured to, during runtime, set a first configuration setting of the first current control device and a second configuration setting of the second current control device, wherein the first configuration setting corresponds to the first adjustable current threshold value and the second configuration setting corresponds to the second adjustable current threshold value, the first configuration setting and second configuration setting based on a negotiated contract corresponding to the first device and the second device; and
wherein the configuration manager is operable to set a third configuration setting of the first current control device, a fourth configuration setting of the first current control device, a fifth configuration setting of the second current control device, and a sixth configuration setting of the second current control device, wherein the third configuration setting corresponds to a first duration threshold value, the fourth configuration setting corresponds to a first enable value, the fifth configuration setting corresponds to a second duration threshold value, and the sixth configuration setting corresponds to a second enable value.

13. The power delivery controller of claim 12, wherein the first current control device includes a hardware current limiter and the second current control device includes a firmware circuit breaker.

14. The power delivery controller of claim 13, wherein the configuration manager is further configured to, in response to detecting the first device has connected to the second device, set a fifteenth configuration setting of the hardware current limiter and a sixteenth configuration setting of the firmware circuit breaker, based on a default contract between the first device and the second device.

15. The power delivery controller of claim 13, wherein the hardware current limiter is to limit the current level to the first adjustable current threshold value and in response to limiting the current level to the first adjustable current threshold value for the first duration threshold value, open the power control device; and the firmware circuit breaker is to monitor the current level for the second adjustable current threshold value and in response to the current level exceeding the second adjustable current threshold value for the second duration threshold value, open the power control device.

16. The power delivery controller of claim 12, wherein the configuration manager is operable to:
in response to a first request from the first device, transition from a first voltage level to a second voltage level and negotiate a new contract different than the negotiated contract;
monitor the current level;
configure one or more of the hardware current limiter or the firmware circuit breaker for a first explicit contract, based on the negotiated contract, the first configuration setting, the second configuration setting, the eleventh configuration setting, the twelfth configuration setting, the thirteenth configuration setting, and the fourteenth configuration setting;
monitor the second device for the second voltage level;
in response to the second device reaching the second voltage level, start a timer including a time limit;
in response to the timer reaching the time limit; configure one or more of the hardware current limiter or the firmware circuit breaker for a second explicit contract based on the first explicit contract, the first configuration setting, the second configuration setting, the eleventh configuration setting, the twelfth configuration setting, the thirteenth configuration setting, and the fourteenth configuration setting; and
monitor the first device for a second request to transition to a third voltage level.

17. The power delivery controller of claim 16, wherein the configuration manager is further configured to:
disable the hardware current limiter, based on the twelfth configuration setting;
enable the firmware circuit breaker, based on the fourteenth configuration setting;
set the first duration threshold value to a first time value based on the eleventh configuration setting;
set the second adjustable current threshold value to a first current value, based on the second configuration setting;
set the second duration threshold value to a second time value based on the thirteenth configuration setting; and
engage the first explicit contract.

18. A power delivery controller incorporated in a first device and operable to control power delivery between the first device and a second device external to the first device, the power delivery controller comprising:
a first input/output terminal adapted to be coupled to the second device via a serial bus;
a second input/output terminal adapted to be coupled to an internal power supply;
a power control device coupled to the first input/output terminal and the second input/output terminal;
a controller coupled to the first input/output terminal, the second input/output terminal and the power control device, the controller including:
a first circuit breaker coupled to the power control device;
a configuration manager coupled to the first circuit breaker; and
a look-up table coupled to the configuration manager;

a second circuit breaker coupled to the controller and the power control device, the second circuit breaker including a first current sensor and a comparator coupled to the first current sensor;
a current limiter coupled to the controller and the power control device, the current limiter including a current clamping circuit and a second current sensor coupled to the current clamping circuit; and
an analog-to-digital converter having an input connected to an output of the current limiter and having an output connected to the controller.

\* \* \* \* \*